US006799735B2

(12) United States Patent
Watanabe et al.

(10) Patent No.: US 6,799,735 B2
(45) Date of Patent: Oct. 5, 2004

(54) NOZZLE PLATE MEMBER FOR SUPPLYING FLUIDS IN DISPERSED MANNER AND MANUFACTURING METHOD OF THE SAME

(75) Inventors: Katsumi Watanabe, Tokyo (JP); Akira Fukuchi, Tokyo (JP)

(73) Assignee: Furukawa-Sky Aluminum Corp., Tokyo (JP)

(*) Notice: Subject to any disclaimer, the term of this patent is extended or adjusted under 35 U.S.C. 154(b) by 20 days.

(21) Appl. No.: 09/883,771

(22) Filed: Jun. 18, 2001

(65) Prior Publication Data

US 2002/0005442 A1 Jan. 17, 2002

(30) Foreign Application Priority Data

Jun. 22, 2000 (JP) ........................................ 2000-187658

(51) Int. Cl.[7] .................................................. B05B 1/00
(52) U.S. Cl. .................. 239/596; 239/548; 29/890.126; 29/890.13
(58) Field of Search ................................. 239/596, 548; 29/805, 525, 890.124, 890.126, 890.13

(56) References Cited

U.S. PATENT DOCUMENTS

| 3,668,756 | A | * | 6/1972 | Wieme | 29/890.09 |
| 5,647,125 | A | * | 7/1997 | Yokoyama | 29/893.34 |
| 6,110,332 | A | * | 8/2000 | Swierkowski | 239/589 |
| 6,371,357 | B1 | * | 4/2002 | Watanabe | 228/138 |

FOREIGN PATENT DOCUMENTS

| JP | 11-285775 | 10/1999 |
| JP | 2000-00584 | 1/2000 |

* cited by examiner

Primary Examiner—Ding Q. Nguyen
(74) Attorney, Agent, or Firm—Knobbe Martens Olson & Bear LLP

(57) ABSTRACT

The present invention is directed to a gas supply nozzle plate constructed by laminating a plurality of metal members each having a fluid path and branch. A fluid nozzle plate member provided by the invention has high sealing at a joined part, and high reliability even when used in high vacuum or at a high temperature. The fluid nozzle plate member comprises a plurality of plate-like metal members each having a fluid path and/or a branch. In this case, the plurality of plate-like metal members are laminated, and the laminated surfaces thereof are joined together by press forging.

10 Claims, 24 Drawing Sheets

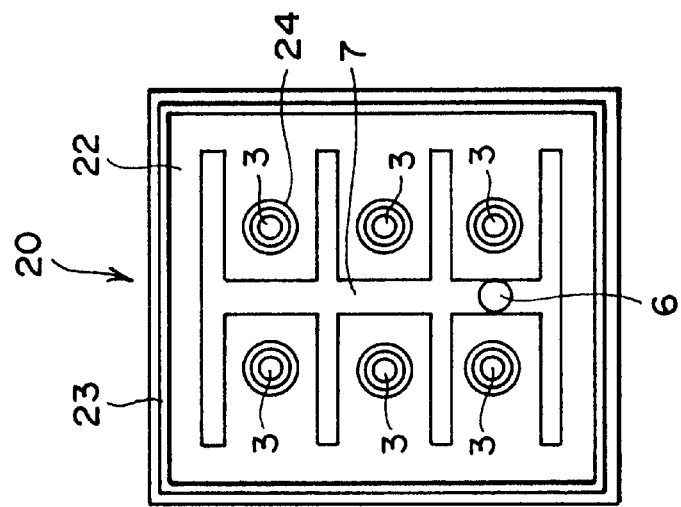
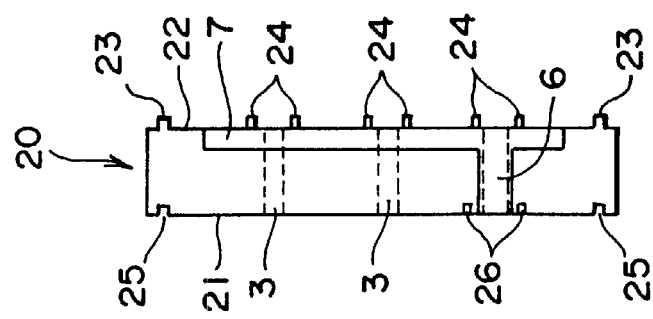
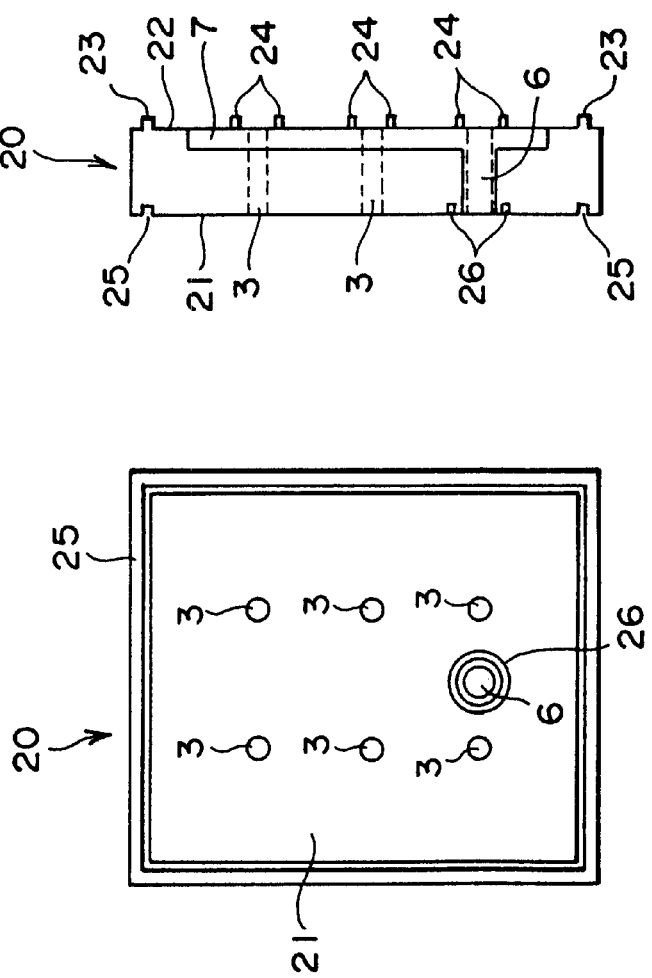

FIG. 26(a)
PRIOR ART
FIG. 26(b)
PRIOR ART
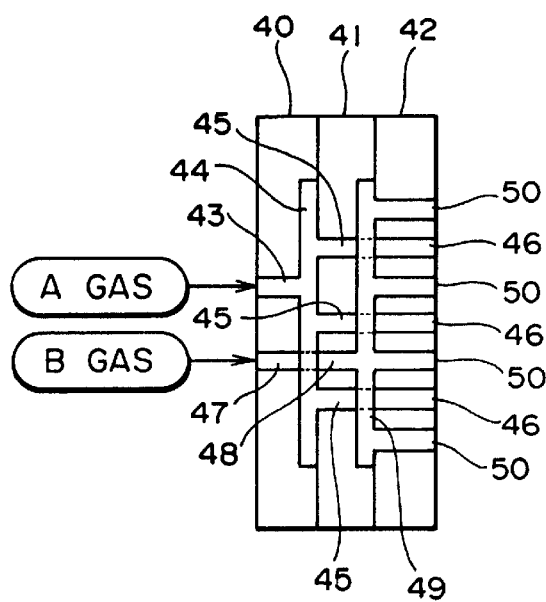
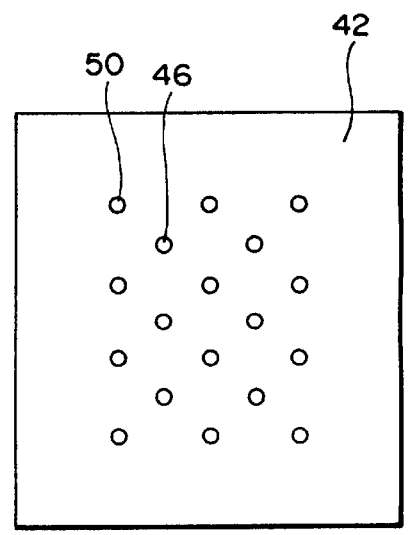

NOZZLE PLATE MEMBER FOR SUPPLYING FLUIDS IN DISPERSED MANNER AND MANUFACTURING METHOD OF THE SAME

BACKGROUND OF THE INVENTION

1. Field of the Invention

The present invention relates to, a nozzle plate member (also referred to as a gas diffusion plate) for supplying fluids in a dispersed manner, and a manufacturing method thereof. More specifically, the invention relates to a film-forming nozzle plate member for dispersing and causing gas to feed and flow out, the gas being used for a film-forming process in manufacturing a semiconductor device or a liquid crystal substrate device, and a manufacturing method of such a nozzle plate member.

2. Description of the Related Art

In the process of manufacturing a semiconductor device or a liquid crystal display substrate, film formation has been carried out by spaying gas to a substrate in the process of chemical vapor deposition (CVD) or the like. In such a film-forming process, each of gases of one, two or more kinds, selected from silane gas, oxygen gas, and so on, is supplied, a plurality of gases are uniformly mixed immediately before the substrate, and then a film is formed on the substrate. In the film-forming process, the dispersed supplying of the plurality of gases must be maintained separately immediately before the gases are reached on the substrate, and each of the gases must be supplied to keep uniform mixing on a substrate surface.

Thus, the inventors examined a conventional nozzle plate like that shown in each of FIGS. 26(a) and 26(b), which was used to disperse gases as fluids in stages and supply them through a number of holes. FIG. 26(a) is a sectional view of a gas supplying nozzle plate, and FIG. 26(b) is a sectional view.

As shown in FIGS. 26(a) and 26(b), the gas supplying nozzle plate is constructed by laminating sheet metal members 40, 41 and 42. The plate metal member 40 includes an A gas path hole 43, its branch 44, and a B gas path hole 47, which are all formed by machining. The plate metal member 41 includes an A gas path hole 45, a B gas path hole 48 and its branch 49, which are all formed by machining. The plate metal member 42 includes an A gas path hole 46 and a B gas path hole 50, which are formed by machining. These plate metal members 40, 41 and 42 are joined together by soldering, electron beam welding or bolt fastening, and then laminated to form a unified body.

In the gas supplying nozzle plate constructed by laminating the metal members 40, 41 and 42, A gas is passed through the path hole 43, branched at the branch 44, and dispersed into a number of flows. Then, the A gas flows out through the path holes 45 and 46 to be supplied to a film-forming region. B gas is passed through the path holes 47 and 48, branched at the branch 49, and dispersed into a number of flows. Then, the B gas flows out through the path hole 50 to be supplied to the film-forming region. Then, the A and B gases are mixed with each other immediately before the substrate to form a film on the substrate.

The gas supplying nozzle plate described above with reference to FIGS. 26(a) and 26(b) can supply gas in a dispersed manner. However, problems have been inherent particularly with respect to sealing, the state of the joined portions of the gas path holes, and so on, in the cases of joining by soldering, electron beam welding, and bolt fastening. Specifically, in the case of joining by soldering, the problems include: a reduction in sealing, which is caused by a pinhole formed by gas entrainment during soldering; a loss of cleanness necessary for semiconductor manufacturing or a liquid crystal substrate manufacturing, which is caused by gas generated from a component such as solder; a loss of dimension or function of the gas path hole, which is caused by damaging the precise and fine gas path hole or the branch, such damaging occurring due to the melting of brazing filler metal during joining; and others. To solve the problem of the damaging the gas path hole caused by the melting of solder during joining, soldering foil was used. However, the use of such soldering foil proved to be costly, because the need to process and dispose the soldering foil to match the shape of the precise and fine gas path hole or the branch resulted in much man-hour. In addition, it was impossible to deal with a temperature of about 400° C. during film formation. This problem occurred because of a limitation placed by a temperature during the film formation.

In the case of joining by electron beam welding, the problems include: the difficulties of securing sealing corresponding to all of a number of precise and fine gas path holes or branches formed in the sheet metal member, and carrying out joining without any hole clogging; the difficulty of manufacturing a large gas nozzle plate because of a limitation placed by the size of a high vacuum chamber, in which electron beam joining is performed; and high costs.

In the case of joining by bolt fastening designed to secure sealing by disposing a gasket, the problems include: a loss of designing freedom satisfying a request made by a user, which occurs because of the need to provide a space for machining and disposing a gasket to match the shape of the precise and fine gas path hole or the branch; high costs caused by much man-hour; and the difficulty of securing complete sealing by the gasket. In addition, heat resistance is a significant matter, particularly since such film formation is often carried out at a high temperature. In this respect, it was difficult to provide sufficient heat resistance by the method using the gasket.

The present invention is directed to a gas supplying nozzle plate, which is constructed by laminating a plurality of metal members having fluid paths formed therein. It is an object of the invention to provide a fluid nozzle plate member capable of providing high sealing at joined portions, and high reliability without any reductions in the functions of highly precise fluid paths and branches even when used in high vacuum or at a high temperature. It is another object of the invention to provide a manufacturing method of such a fluid nozzle plate member.

SUMMARY OF THE INVENTION (1) In accordance with the present invention, there is provided a nozzle plate member for supplying fluids in a dispersed manner, comprising a plurality of plate-like metal members each having a fluid path and/or a branch and an annular groove or an annular protrusion around the periphery of the surface of the plate-like metal member. In this case, the plurality of plate-like metal members are laminated by inserting the protrusion into the groove, and press forging is executed for junction of the laminated surfaces thereof.

(2) An annular groove is further provided around the fluid path and/or a branch on the surface of one of the surface to be joined of one of the laminated plate-like metal members, an annular protrusion is provided around the fluid on another surface to be placed oppositely to the former, the annular protrusion is inserted into the annular groove, and then press forging is executed for junction.

(3) The fluid path and/or the branch are formed for each kind of fluids, and each kind of fluids is dispersed to flow out. An annular groove and an annular protrusion are provided around the fluid path and/or a branch on a surface and on the opposing surface to be joined of the laminated metal members, the positions of the annular groove and protrusion being defined for each kind of the fluids. The annular protrusion is inserted into the annular groove, and then press forging is executed for junction.

(4) Further annular grooves are respectively provided around the fluid path and/or branch on the opposing positions of the surfaces being joined of the plurality of metal members each having the fluid path and/or the branch. An intermediate metal member for filling each of the annular grooves is inserted and laminated, and then press forging is executed for junction.

(5) The fluid path and/or the branch is formed for each kind of fluids, and annular grooves are respectively provided in positions defined for each kind of the fluids. An intermediate metal member for filling each of the annular grooves is inserted, and then press forging is executed for junction.

(6) The nozzle plate member can be so constructed that the fluid path and/or the branch is formed for each kind of fluids and an annular protrusion is provided through which the fluid path is provided and is extended through an opposing plate-like metal member.

(7) Preferably, each of the metal members is made of one selected from aluminum metal or an aluminum alloy, because it facilitates press forging.

(8) Furthermore, it is preferred that the fluid path and/or the branch formed in the metal member made of one selected from the aluminum metal and the aluminum alloy is subjected beforehand to surface treatment to prevent corrosion. This is because gas for film formation is usually corrosive.

(9) The nozzle plate member for supplying fluids in a dispersed manner is suitably used as a nozzle plate for dispersing and supplying gas for film formation on a semiconductor device or a liquid crystal display device.

(10) In anther embodiment of the invention, there is provided a manufacturing method regarding the foregoing nozzle plate member for supplying fluids in a dispersed manner. This manufacturing method comprises the steps of: preparing a plurality of plate-like metal members each having a fluid path and/or a branch and an annular groove or an annular protrusion on a peripheral surface of the metal member; and laminating the plurality of plate-like metal members by inserting the protrusion into the groove, and joining the laminated surfaces thereof by press forging.

(11) The manufacturing method of a nozzle plate member further comprises steps of: an annular groove is provided around a fluid path and/or a branch on a surface of one of the laminated plate-like metal members, an annular protrusion is provided around a fluid path and/or a branch on an another surface of the metal member placed oppositely to the former, the annular protrusion is inserted into the annular groove, and then press forging is executed for junction.

(12) The manufacturing method of a nozzle plate member further comprises steps of: an annular groove is provided around a fluid path and/or a branch on a surface of one of the laminated plate-like metal members, an annular groove is also provided around a fluid path and/or a branch on another surface of the metal member placed oppositely to the former, an intermediate metal member to fit in the annular grooves is inserted, and then press forging is executed for junction.

(13) In the manufacturing method of a nozzle plate member each of the metal members is preferably made of one selected from aluminum metal and an aluminum alloy.

(14) In the manufacturing method of a nozzle plate member a step is further provided to subject the fluid path and/or the branch formed in the metal member made of one selected from the aluminum metal and the aluminum alloy beforehand to surface treatment to prevent surface corrosion.

(15) In the manufacturing method of the nozzle plate member, the press forging is preferably carried out at a pressure set in the range of 3 to 100 kgf/mm$^2$.

(16) Furthermore, the press forging is preferably carried out at a temperature set in the range of 300 to 500° C. It is because press forging of aluminum is easy in this temperature range.

BRIEF DESCRIPTION OF THE DRAWINGS

FIGS. 5(a) to 5(c) are views, each showing an aluminum metal member constituting the nozzle plate of the first embodiment.

FIGS. 26(a) and 26(b) are views, each illustrating a nozzle plate according to a conventional art.

DESCRIPTION OF THE PREFERRED EMBODIMENTS

Figure 1:
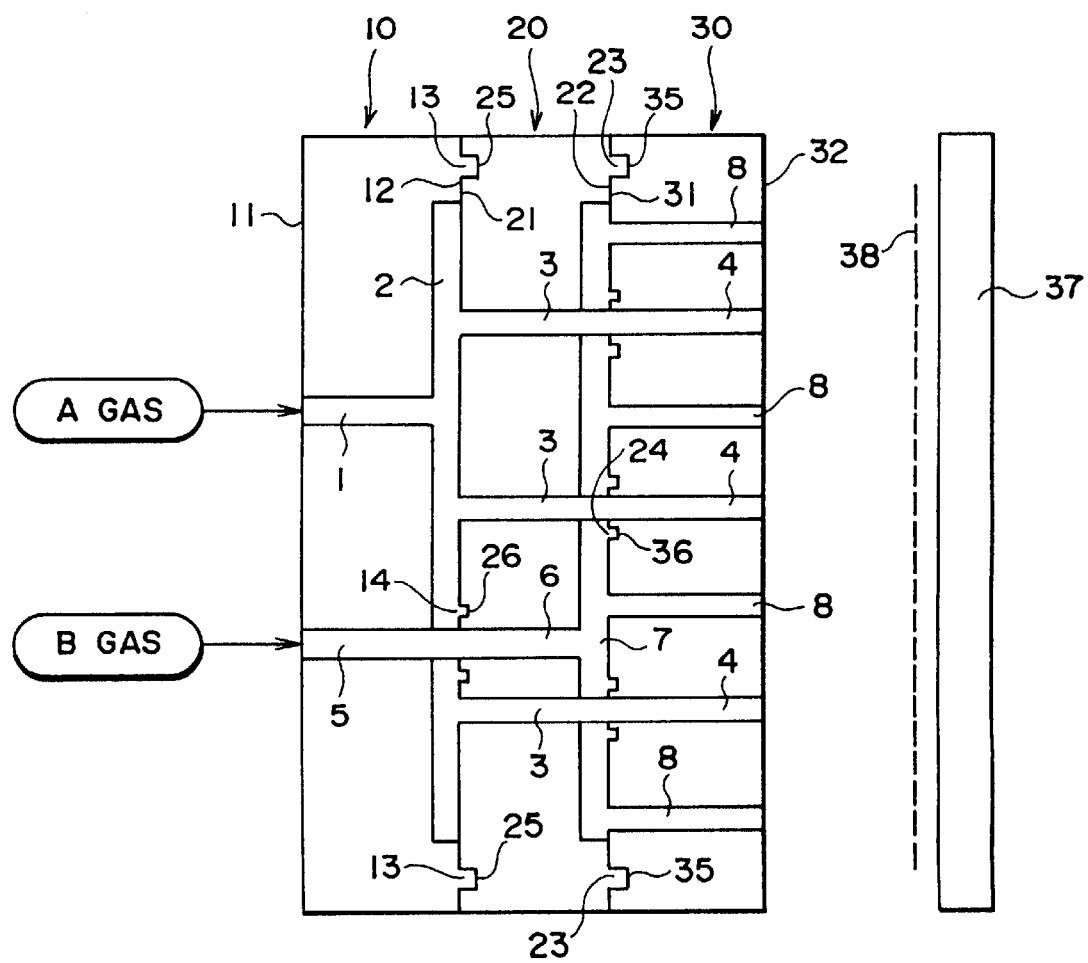
FIG. 1 is a sectional view showing a nozzle plate according to a first embodiment of the present invention.

The following description will be made of the preferred embodiments of the present invention with reference to the accompanying drawings.

A fluid dispersion nozzle plate or a gas dispersion plate provided by the invention is designed to pass given fluids, irrespective of gas or liquid. The nozzle plate is specifically constructed by laminating a plurality of plate metal members, each of which has a fluid path and/or a branch and at least an annular groove and an annular protrusion around the periphery of the surface of the plate-like metal member, which prevents gas leakage from the side surfaces of the laminated plate-like metal member and adapted to cause fluids to flow out in a dispersed manner. The surfaces of the laminated metal members are joined together by press forging, and excellent sealing is provided by means of solid phase diffusion junction.

The fluid dispersion nozzle plate of the invention adapted, as described above, to cause given fluids to flow out in a dispersed manner irrespective of gas or liquid and is used as a gas dispersion nozzle plate or a gas dispersion plate for film formation, which disperses, for example gas as fluids to flow out. This fluid dispersion nozzle plate is applied to a film-forming device used for manufacturing a semiconductor or a liquid crystal substrate, specifically for a chemical vapor deposition (CVD) equipment.

In the case of forming a film by the CVD device, the mixing of different kinds of gases must be prevented until the time immediately before the formation of a film by the CVD device. For this purpose, each kind of gas is widely and uniformly dispersed in stages by the gas path or the branch of the gas dispersion nozzle plate, and then sprayed to a target substrate. As each kind of gas is be uniformly dispersed and then sprayed by the invented nozzle plate, uniform mixing of different kinds of gases can be secured immediately before the target substrate.

To uniformly disperse and then spray gas, preferably, a number of small-size gas path holes of about 1 mm in diameter should be provided in the outlet side of the gas nozzle plate. The nozzle plate of the invention is used to form a film, especially for a semiconductor or a TFT liquid crystal display, by means of CVD. This nozzle plate is, for example, a plate-like nozzle plate member having a width of 500 to 1000 mm, a length of 600 to 1200 mm, and a thickness of 15 to 30 mm. Gas is supplied from one surface side of the plate, while a gas for film formation is passed out to a substrate surface from the other surface having a number of nozzle plate holes. For the gas supplied for film formation, one may be selected from, e.g., silane gas ($Si_n H_{2n+2}$), oxygen gas, and so on.

The other embodiment of the nozzle plate structure are as follows. An annular groove and an annular protrusion are provided around the fluid path and/or a branch on the opposing positions of the joining surfaces of the laminated metal members. In this case, the annular protrusion is inserted into the annular groove, and then press forging is applied for junction. Accordingly, high sealing is secured to completely prevent the leakage of fluids around the path and branch.

A fluid path hole may be provided in the annular protrusion formed in the joined surface of one of the laminated metal members. This arrangement also enables junction to be carried out by inserting the annular protrusion into the annular groove, and then applying press forging.

The annular groove and the annular protrusion of the metal members may be provided in positions defined for each kind of fluids. In this case, the annular protrusion is inserted into the annular groove, and press forging is applied for junction. Accordingly, sealing is secured in a fluid path and a branch portion formed for each kind of fluids to prevent the leakage of fluids from the fluid path of the joined surface of the metal member and the connected part of the branch.

Annular grooves may be provided around the fluid path and/or a branch respectively in the opposing positions of the joining surfaces of the laminated metal members. In this case, an intermediate metal member is inserted to fill each of the annular grooves, and then press forging and compression are applied for junction. Accordingly, high sealing is secured to prevent the leakage of fluids.

Annular grooves may be provided respectively in the opposing positions of the joined surfaces of the metal members, the positions being defined for each kind of fluids. In this case, an intermediate metal member is inserted to fill each of the annular grooves, and press forging is applied for junction. Accordingly, sealing is secured in a fluid path and a branch formed for each kind of fluids to prevent the leakage of fluids from the fluid path of the joined surface of the metal member and the connected part of the branch.

It is particularly important to note that high sealing is secured for the nozzle plate of the invention designed as a gas diffusion nozzle plate for film formation on the semiconductor, which is constructed by laminating the plurality of metal members, each having a fluid path and/or a branch, and adapted to cause fluids to flow out in a dispersed manner.

The fluid path and/or the branch of the invention is formed for each kind of fluids, and the annular groove and the annular protrusion of the joined surfaces are installed in the positions defined for each kind of fluids.

The metal constituting the plate nozzle member is preferably selected from aluminum or aluminum alloy like AA 1050, 3003, 5052, 6061, 6063 defined in JIS (Japanese Industrial Standard) H4000, for example, which is easy to be joined by press forging. There are no special limitations placed on the material quality or the production method of aluminum metal or an aluminum alloy. However, a rolled plate or a forged plate having less internal defects should preferably be used.

The use of identical materials for aluminum metal or aluminum alloy members being laminated facilitates physical metal junction, because of the compression of a joined portion caused by deformation during press forging. However, different materials can be used for junction, which can be formed by press forging.

In the following is referred to the condition and effect of press forging for aluminum and aluminum alloy. Aluminum plate, whose surfaces are cleaned, are laminated and pressed by forging with 3 to 100 $kgf/mm^2$ in a temperature range between 300 and 500 degree C. for 30 to 60 second. Then the surfaces are bonded in solid state. The proof strength (0.2% elongation) of aluminum is about 7 $kgf/mm^2$ at room temperature. As the proof strength of the metal is about less than 3 $kgf/mm^2$, the press forging with a press force more than 3 $kgf/mm^2$ induces plastic deformation and the pressed surfaces are bonded in solid state. This solid state bonding is explained by the following examples. Two bars with 20 mm in diameter made of aluminum alloy AA 5052 prepared. The one is provided with a dent having 6 mm in diameter and 5 mm depth at the end and the other is provided with a protrusion having 5.8 mm in diameter and 8 mm in length at the end. The protrusion is inserted into the dent and was press forged with a pressure of 14 kgf/mm$^2$ at 400 degree C. After the press forgoing samples including the bonded part were machined and prepared. The tensile test at room temperature showed that the proof strength (0.2% elongation) was about 22 kgf/mm$^2$, which is equal to that of the original metal bar. And observation under microscope revealed that the microscopic structure of the bond is identical and continuous with the other part. As explained the press forging will bring forth a solid state metal bonding of the metal like aluminum and its alloy. Based on the experiments a temperature range of 300 to 500 degree C. and a press force of 3 to 100 kgf/mm$^2$ are shown to be preferable. And when the temperature is higher in the range, the press force is required to be lower in the force range. The condition is designated to aluminum and its alloy but the specific condition should be selected for the other metal like copper and its alloy.

The composition of aluminum alloy can be changed depending on a heat resisting requirement for the fluid path member, or changed to a different metallic material being bonded by press forging.

According to the invention, the annular groove and the annular protrusion provided on the joining surfaces of the laminated metal members are formed by, for example, machining. However, any of the other processing methods may be used as long as dimension accuracy and a surface shape equal/identical to those by machining are obtained. For example, the annular groove and the annular protrusion formed on the joined surfaces of the aluminum or aluminum alloy members should preferably be subjected to surface-cleaning before the execution of press forging. Typically, grease is removed from the surface by using nitric acid, the surface is washed by water, and caustic treatment is carried out for etching with alkali solution. Further, washing by water, cleaning by nitric acid, washing by water, washing by hot water, and other steps are properly combined to clean the surface. When a metal member to be laminated is aluminum or an aluminum alloy, a temperature for press forging should preferably be set in the range of 300 to 500 degree C.

Furthermore, according to the invention, the surface of the fluid path and/or the branch formed in each of the metal members to be laminated should preferably be subjected to surface treatment, such as chemical film formation, anodic oxidation, or the like, to prevent corrosion according to the kind of fluids. Specifically, surface treatment such as chemical film formation, anodic oxidation or the like is carried out for the gas path and/or the branch formed in the aluminum or aluminum alloy member to be laminated to prevent corrosion according to the kind of gas, and thereby a gas diffusion plate for film formation is provided. Next, specific embodiments of the invention will be described with reference to the drawings.

First Example

Figure 2:
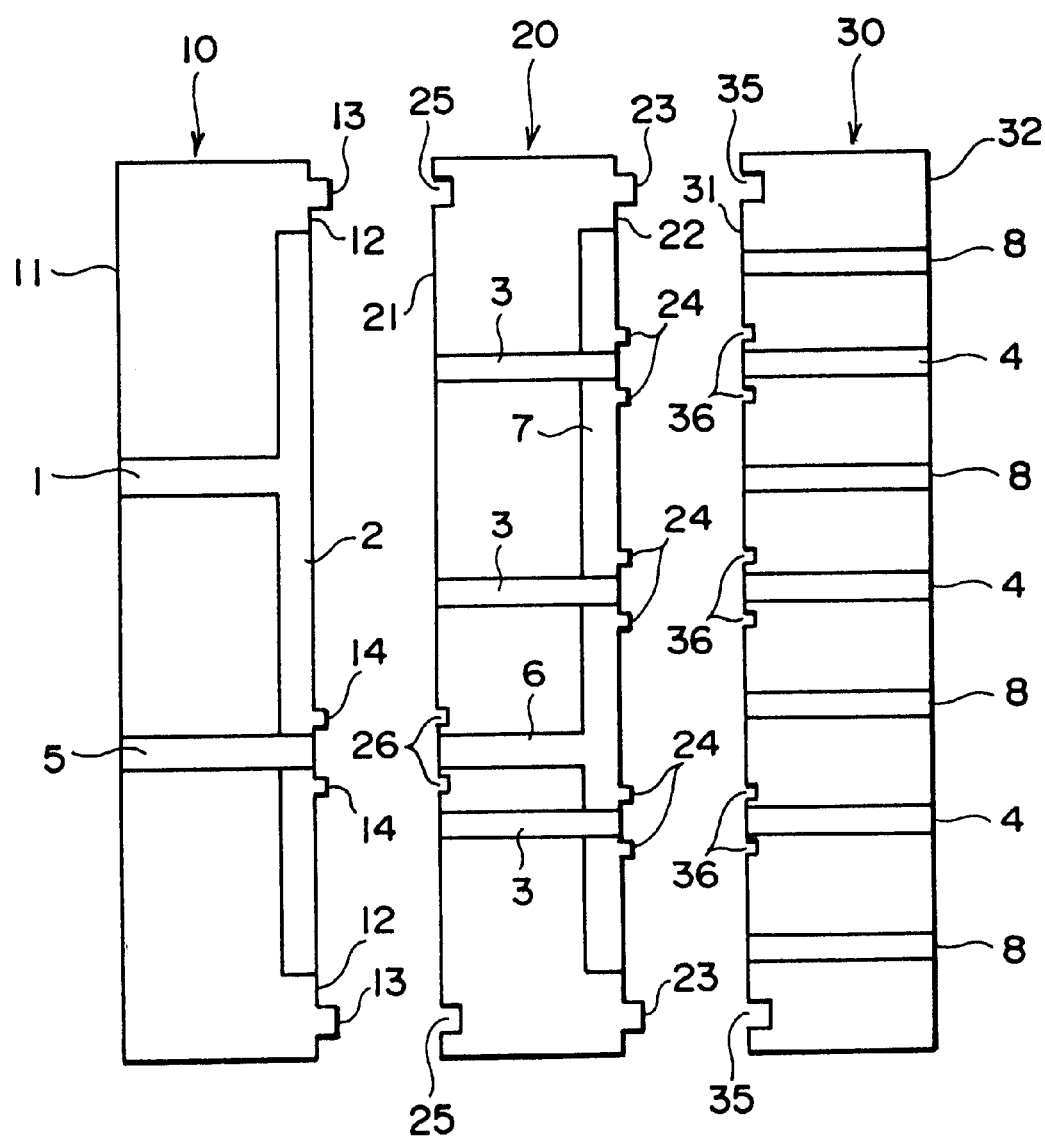
FIG. 2 is a view showing an aluminum plates constituting the nozzle plate of the first embodiment.

Explanation will be made of a first embodiment of the invention by referring to FIGS. 1 to 12. FIG. 1 is a sectional view showing a nozzle plate member constructed by laminating aluminum or aluminum alloy plates according to the first embodiment of the invention; FIGS. 2 to 8 views, each illustrating an aluminum plate constituting the nozzle plate member; FIG. 9 a perspective view showing the lamination of metal members; and FIGS. 10 to 12 views, each showing junction by press forging the annular groove and the annular protrusion of joined surfaces. As shown in FIGS. 1, 2 and 9, a gas nozzle plate comprises aluminum plates 10, 20 and 30 having gas path holes and branch formed therein. Each plate is provided with peripheral protrusion 13 and, 23 and a peripheral groove 25 and 35. By a gas path and a branch for each kind of A and B gases, gas is widely dispersed in stages, and then sprayed.

Figure 3C:
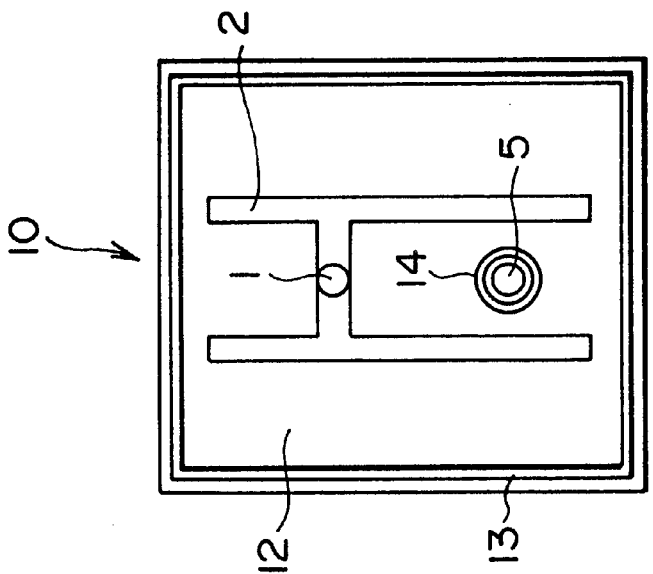
FIGS. 3(a) to 3(c) are views, each showing a laminated metal members included in the first embodiment.
Figure 3B:
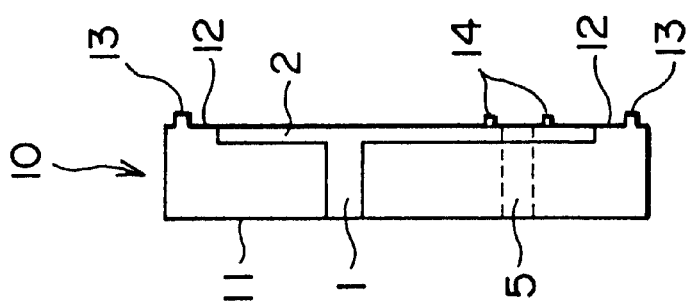
Figure 3A:
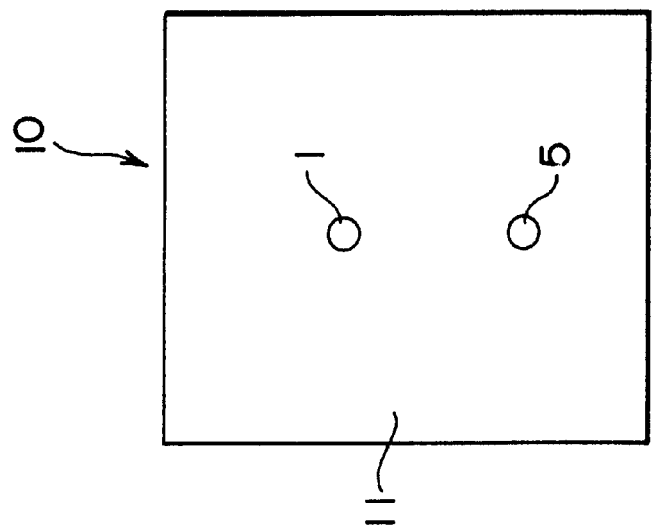
Figure 4A:
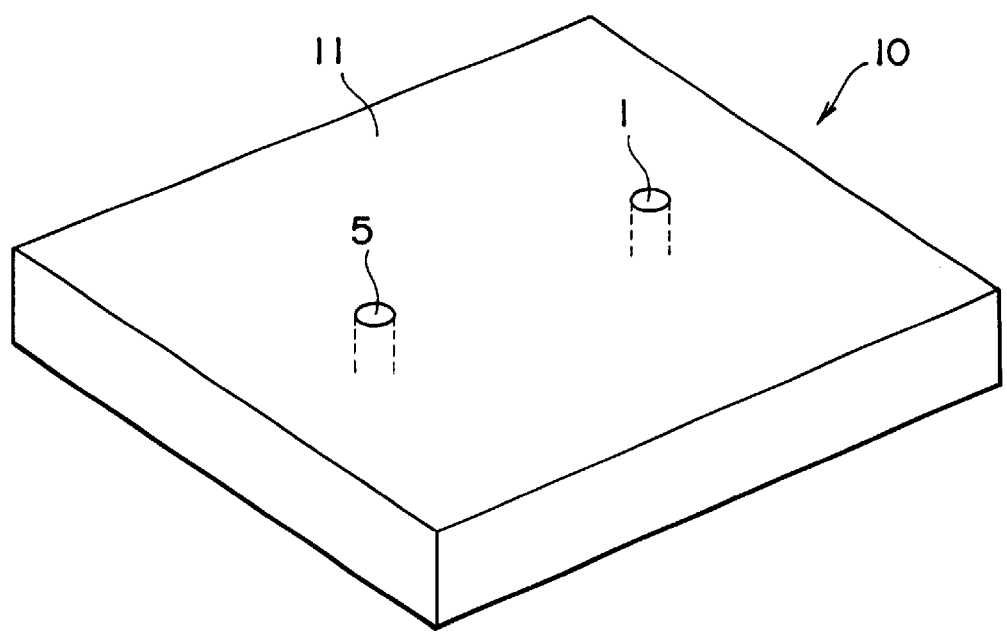
FIGS. 4(a) and 4(b) are views, each showing aluminum plates constituting the nozzle plate of the first embodiment.
Figure 4B:
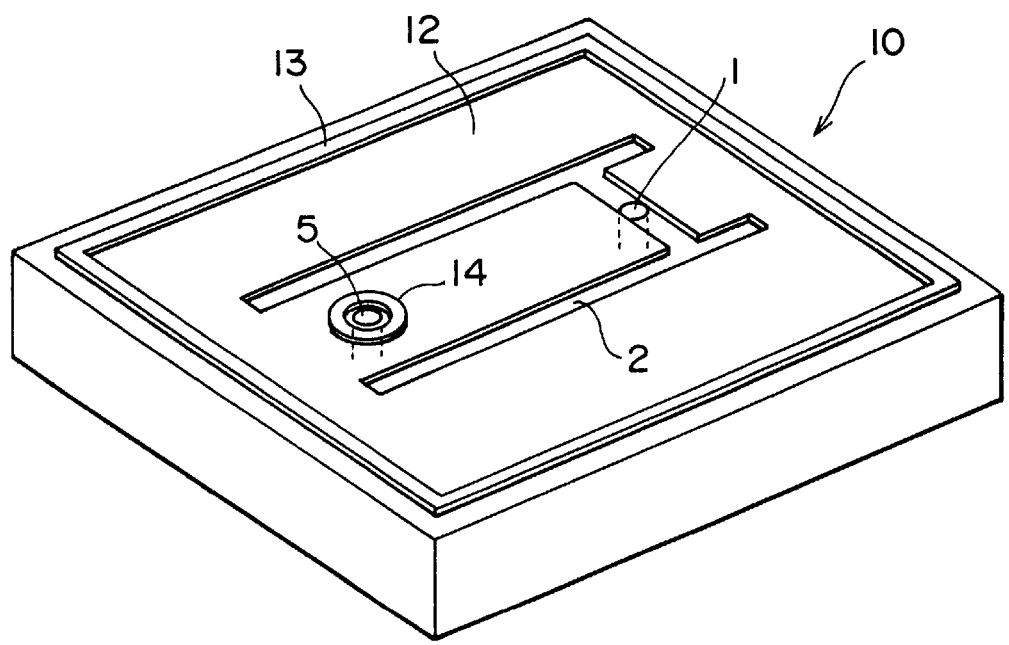

The aluminum plate 10 is now described by specifically referring to FIGS. 3(a), 3(b) and 3(c), and FIGS. 4(a) and 4(b). FIG. 3(a) is a plan view of the outer surface (gas supply side) of the aluminum plate 10; FIG. 3(b) a sectional view of the aluminum plate 10; and FIG. 3(c) a plan view of the joined surface of the aluminum plate 10. FIG. 4(a) is a perspective view showing the outer surface (gas supply side) of the aluminum plate 10; and FIG. 4(b) a perspective view showing the joined surface of the aluminum plate 10.

As shown in FIGS. 3(a) to 3(c), and FIGS. 4(a) and 4(b), the aluminum plate 10 includes an A gas path hole 1, an H-shaped A gas branch 2, and a B gas path hole 5, which are all formed from the outer surface 11 to the joined surface 12. The joined surface 12 includes an annular protrusion 13 formed in the outer periphery, and an annular protrusion 14 formed around the B gas path hole 5.

Figure 6A:
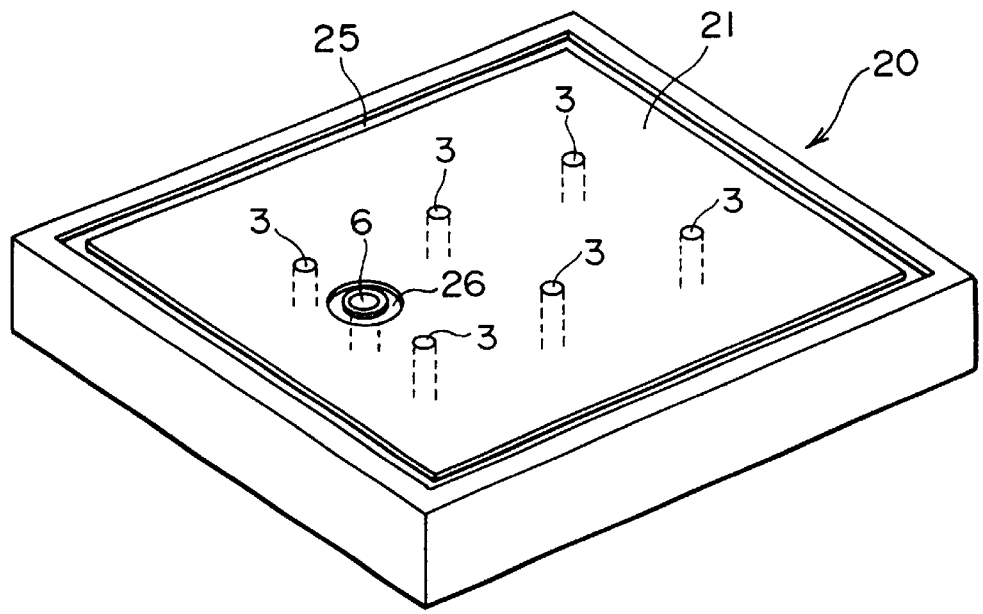
FIGS. 6(a) and 6(b) are views, each showing the aluminum metal member constituting the nozzle plate of the first embodiment.
Figure 6B:
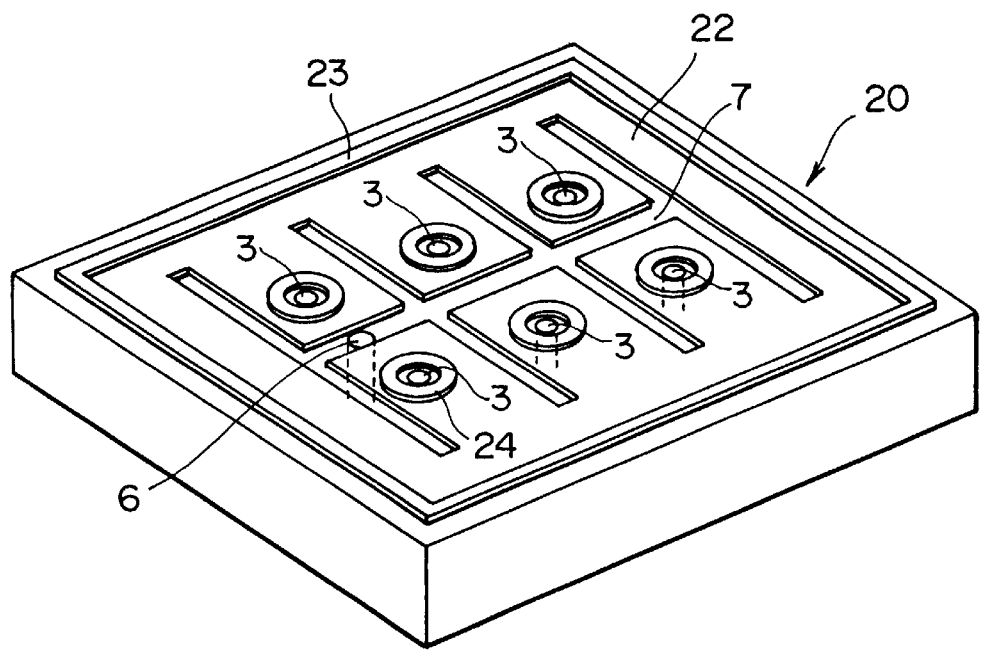

The aluminum plate 20 is now described by specifically referring to FIGS. 5(a) to 5(c), and FIGS. 6(a) and 6(b). FIG. 5(a) is a plan view of the joined surface of the aluminum plate 20 with the aluminum plate 10; FIG. 5(b) a sectional view of the aluminum plate 20; and FIG. 15(c) a plan view of the joined surface of the aluminum plate 20 with the aluminum plate 30. FIG. 6(a) is a perspective view showing the joined surface of the aluminum plate 20 with the aluminum plate 10; and FIG. 6(b) a perspective view showing the joined surface of the aluminum plate 20 with the aluminum plate 30.

As shown in FIGS. 5(a) to 5(c), and FIGS. 6(a) and 6(b), the aluminum plate 20 includes a plurality (six in the drawings) of A gas path holes 3 formed from a joined surface 21 to the joined surface 22 of its opposite side. Each of the A gas path holes 3 is provided in a position corresponding to the A gas branch 2 having an H groove shape, formed in the aluminum plate 10. The aluminum plate 20 also includes a B gas path hole 6, and a B gas branch 7 having a frame-like groove shape, which are formed from the joined surface 21 to the joined surface 22. The B gas path hole 6 is provided in a position corresponding to the gas path hole 5 of the aluminum plate 10.

In the joined surface 21 of the aluminum plate 20, annular grooves 25 and 26 are formed respectively in the outer periphery and around the B gas path hole 6. The annular groove 25 is formed in a position opposite the annular protrusion 13 formed in the joined surface 12 of the aluminum plate 10. The annular groove 26 is formed in a position opposite the annular protruded 14 formed in the joined surface 12 of the aluminum plate 10. In addition, in the joined surface 22 of the aluminum plate 20, annular protrusion 23 and 24 are formed respectively in the outer periphery and around the A gas path hole 3.

Figure 7C:
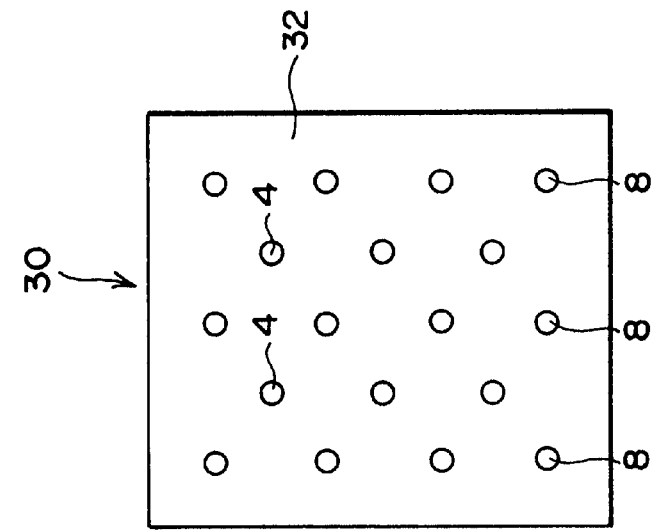
FIGS. 7(a) to 7(c) are views, each showing the aluminum metal member constituting the nozzle plate of the first embodiment.
Figure 7B:
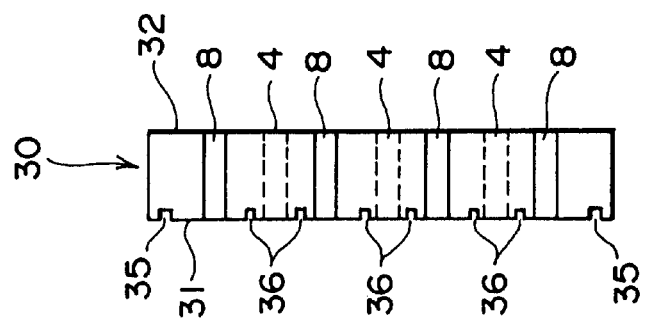
Figure 7A:
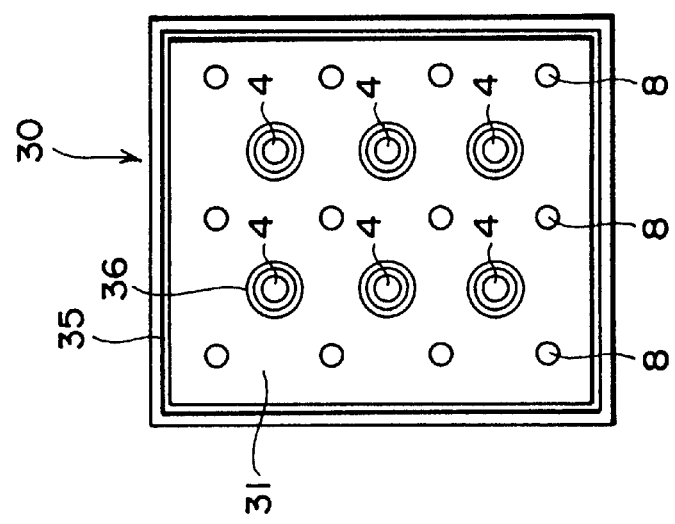
Figure 8A:
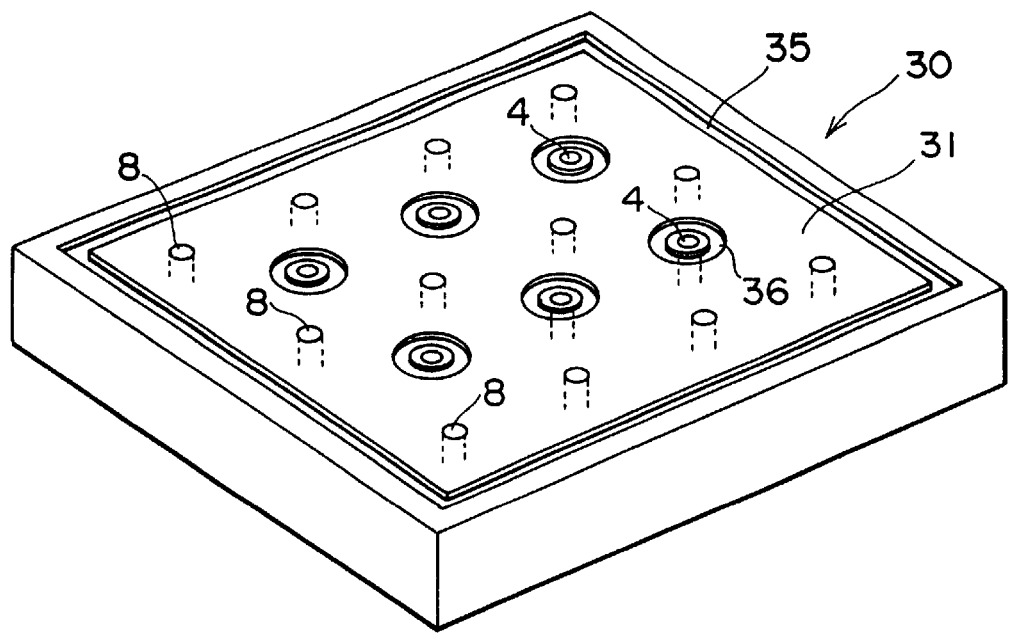
FIGS. 8(a) and 8(b) are views, each showing the aluminum metal member constituting the nozzle plate of the first embodiment.
Figure 8B:
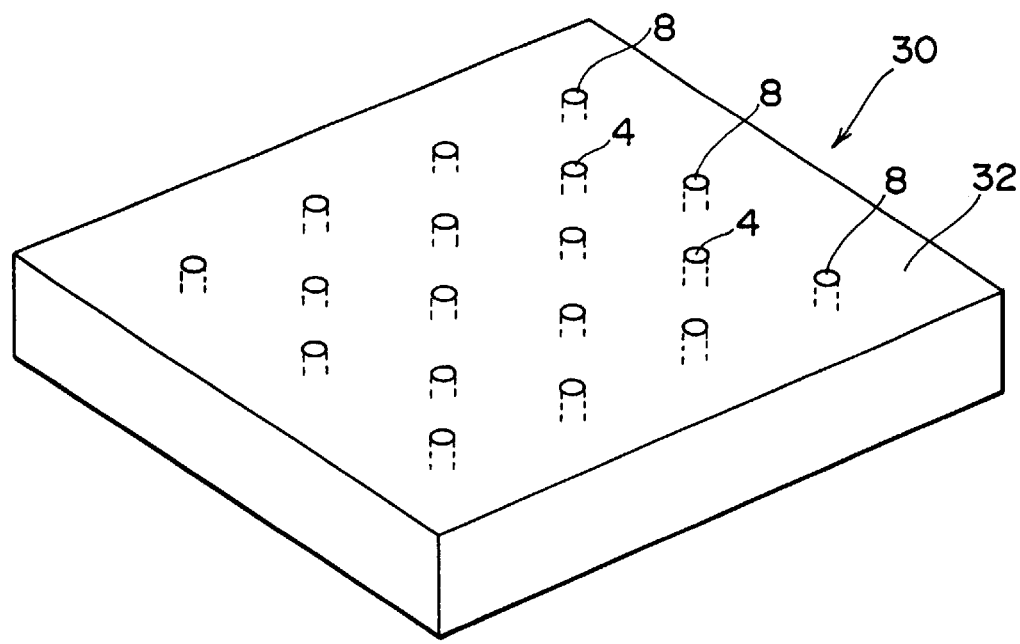
Figure 9:
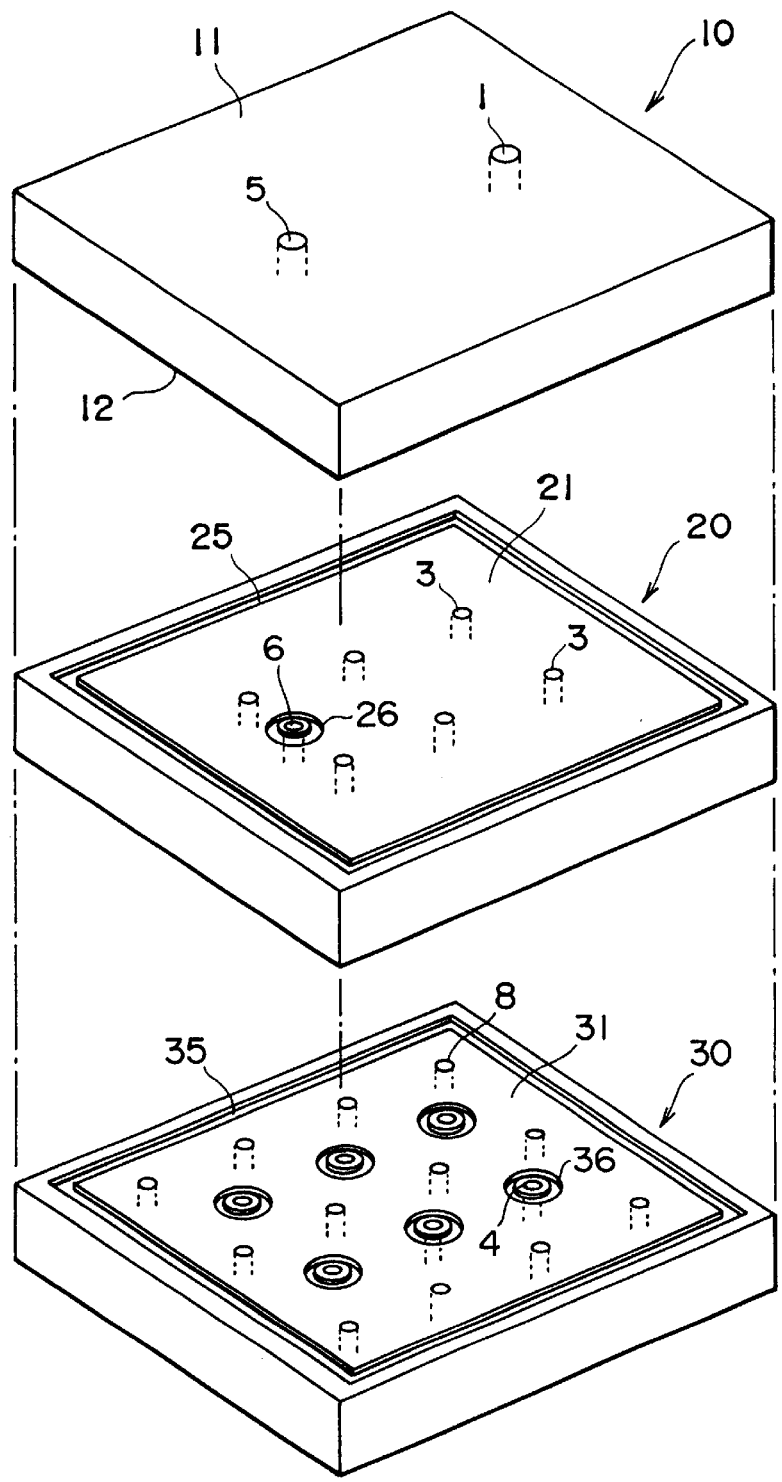
FIG. 9 is a view showing a laminated state of the metal members included in the first embodiment.

The aluminum plate 30 is now described by specifically referring to FIGS. 7(a) to 7(c), and FIGS. 8(a) and 8(b). FIG. 7(a) is a plan view of the joined surface of the aluminum plate 30 with the aluminum plate 20; FIG. 7(b) a sectional view of the aluminum plate 30; and FIG. 7(c) a plan view of the outer surface (gas outlet side) of the aluminum plate 30. FIG. 8(a) is a perspective view showing the joined surface of the aluminum plate 30 with the aluminum plate 20; and FIG. 8(b) a perspective view showing the outer surface (gas outlet side) of the aluminum plate 30.

As shown in FIGS. 7(a) to 7(c), and FIGS. 8(a) and 8(b), the aluminum plate 30 includes a plurality (six in the drawings) of A gas path holes 4, and a plurality (twelve in the drawings) of B gas path holes 8, which are formed from a joined surface 31 to a gas outlet surface 32.

The plurality of A gas path holes 4 are provided in positions respectively corresponding to the plurality of A gas path holes 3 of the aluminum plate 20. The plurality of B gas path holes 8 are provided in positions corresponding to the B gas branch 7 of the frame-like groove shape.

In the joined surface 31 of the aluminum plate 30, annular grooves 35 and 36 are formed respectively in the outer periphery and around the A gas path hole. The annular groove 35 of the outer periphery is formed in a position opposite the annular protrusion 23 formed in the joined surface 22 of the aluminum plate 20. The annular groove 36 is formed in a position opposite the annular protrusion 24 formed in the joined surface 22 of the aluminum plate 20.

The aluminum plate 30 was shown to have six A gas path holes and twelve B gas path holes. This is a simplified drawing designed to facilitate understanding. In practice, however, a number of gas path holes are provided in the gas dispersion plate in a widely dispersed manner. In addition, the H-shaped and frame-like types were shown as the gas branch portions. However, any other types can be used as long as gas is branched and widely dispersed.

The aluminum plates 10, 20 and 30 prepared in the foregoing manner are then laminated as shown in FIGS. 2 and 9. The branch 2 of the A gas path hole 1 formed in the aluminum plate 10 is connected to the plurality of A gas path holes 3 of the aluminum plate 20. The plurality of A gas path holes 3 are in turn connected respectively to the A gas path holes 4 of the aluminum plate 30. The B gas path hole 5 of the aluminum plate 10 is connected to the B gas path hole 6 of the aluminum plate 20. The branch 7 of the B gas path hole 6 is connected to the plurality of B gas path holes 8 of the aluminum plate 30.

The annular protrusion 13 formed in the outer periphery of the joined surface 12 of the aluminum plate 10 is combined with the annular groove 25 formed in the joined surface 21 of the aluminum plate 20. The annular protrusion 14 formed in the joined surface 12 of the aluminum plate 10 is combined with the annular groove 26 formed in the joined surface 21 of the aluminum plate 20.

Likewise, the annular protrusion 23 formed in the outer periphery of the joined surface 22 of the aluminum plate 20 is combined with the annular groove 35 formed in the joined surface 31 of the aluminum plate 30. The annular protrusion 24 formed in the joined surface 22 of the aluminum plate 20 is combined with the annular groove 36 formed in the joined surface 31 of the aluminum plate 30.

Thus, the A gas path holes, the branch thereof, the B gas path holes and the branch thereof of the aluminum plates 10, 20 and 30 are aligned with one another, the annular grooves and the annular protrusion are combined together, and press forging is then executed for junction, thereby unifying the aluminum plates 10, 20 and 30. As a result, the manufacturing of a gas dispersion nozzle plate is completed.

Now, more specific description will be made of the portion of junction formed by combining the annular groove and the annular protrusion with each other, and executing press forging with reference to FIGS. 10 to 12.

Figure 10:
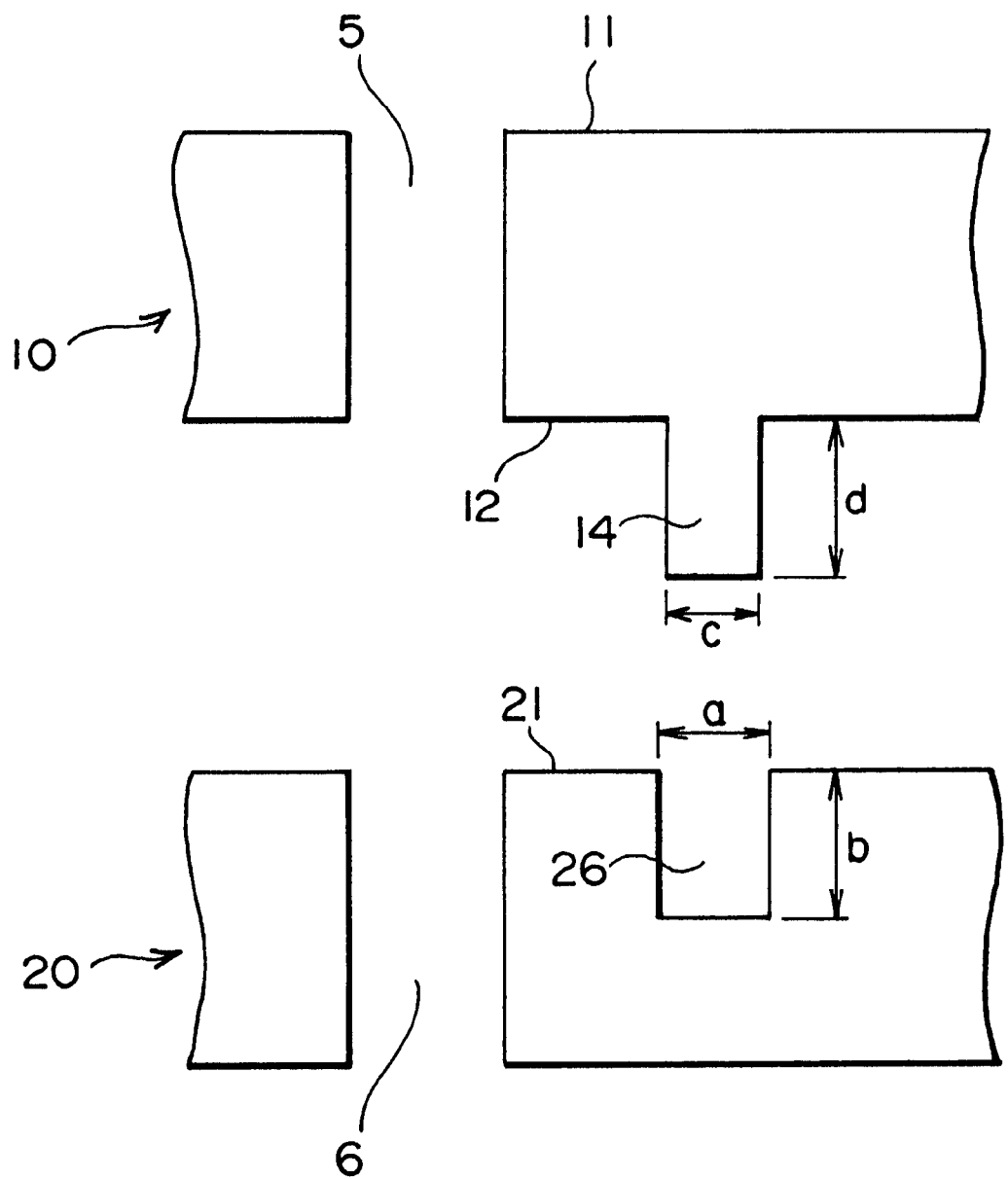
FIGS. 10 to 12 are views, each showing an annular groove and an annular protrusion of an aluminum metal member to be joined in the first embodiment.
Figure 11:
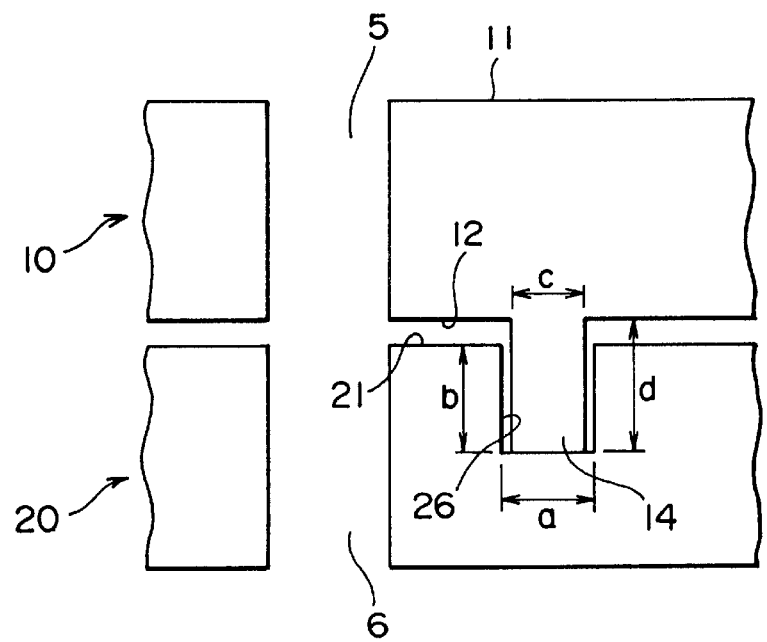
Figure 12:
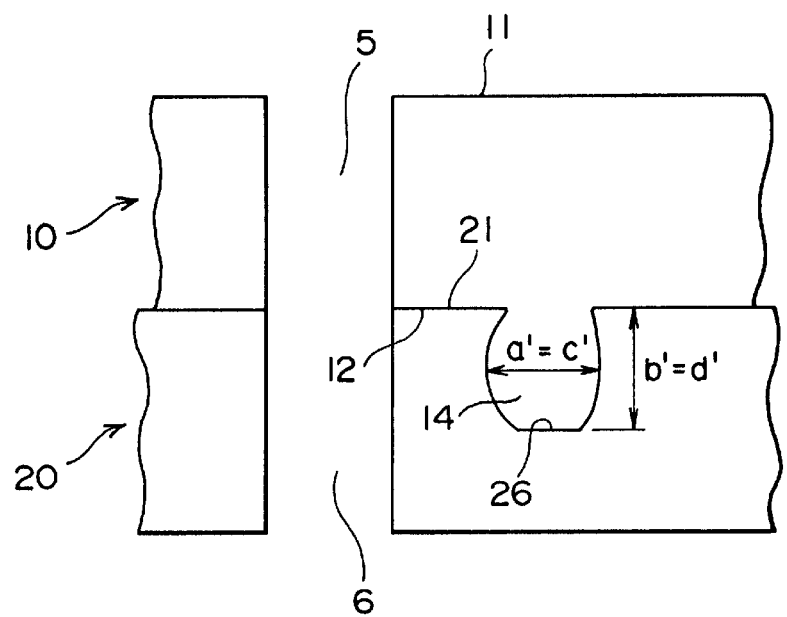

Each of FIGS. 10 to 12 is a partially expanded view showing in section the annular grooves and the annular protrusion of the aluminum plates 10 and 20 to be laminated, shown in FIG. 2.

First, as shown in FIG. 10, in the joined surface 12 of the aluminum plate 10, the annular protrusion 14 is provided around the B gas path hole 5. In the joined surface 21 of the aluminum plate 20, the annular groove 26 is provided for the B gas path hole 6. Then, as shown in FIG. 11, the annular protrusion 14 of the aluminum plate 10 is inserted into the annular groove 26 of the aluminum plate 20, and this portion is subjected to press forging. By such press forging, as shown in FIG. 12, the annular protrusion 14 of the aluminum plate 10 is joined to the annular groove 26 of the aluminum plate 10 by filling the inside thereof.

A specific relation between the annular groove and the annular protrusion is as follows. That is, when a width and a depth of the annular groove 26 are respectively a and b, and a width and a height of the annular protrusion 14 are respectively c and d, the following relation should preferably be set:

$$a \times b \leq c \times d \text{ and } b < d$$

These relations result in the filling of the annular groove 26 inside with the annular protrusion 14, enabling sealing to be secured.

In addition, a relation of $a > c$ is set to facilitate the insertion of the annular protrusion 14 into the annular groove 26 and its combination with the same. Even when the relation of $a > c$ is satisfied, however, if the width c of the annular protrusion 14 is too small compared with the width a of the annular groove 26, then the annular protrusion 14 may be bent during press forging, disabling the annular protrusion 14 from filling the annular groove 26. Preferably, therefore, the width c of the annular protrusion 14 should not be too small compared with the width of the annular groove 26. Even in the case of a relation a□c, the tip of the annular protrusion is tapered, and sealing can be secured when forcible pressing-in is allowed.

The relation between the annular protrusion 14 and the annular groove 26 was described. Similarly, the other annular protrusion can be inserted into the annular groove, and these portions are subjected to press forging and compression so as to be joined.

In the gas dispersion nozzle plate thus constructed by laminating the aluminum plates 10, 20 and 30, as shown in FIG. 1, A gas is passed through the path hole 1, and widely dispersed at the branch surface 2. The A gas is then caused to flow out through the number of path holes 3 and 4, and supplied to a film-forming side. B gas is passed through the path holes 5 and 6, and widely dispersed at the branch 7. The B gas is then caused to flow out through the number of path holes 8, and supplied to the film-forming side. The A and B gases are mixed immediately before the substrate, and then a film 38 is formed on the substrate 37.

As shown in FIG. 1, in the joined surfaces 12 and 21 of the aluminum plates 10 and 20, sealing is secured for the connected parts of the B gas path holes 5 and 6, because of the junction of the peripheries thereof by press forging the annular protrusion 14 and the annular groove 26. Accordingly, the leakage of B gas from the connected parts can be prevented, and the incursion of other gases can also be prevented. In the joined surfaces 12 and 21 of the metal members 10 and 20, sealing is secured because of the junction by press forging the annular protrusion 13 and the annular groove 25 in the outer periphery. Accordingly, the leakage of A gas from the gas dispersion nozzle plate to the outer periphery can be prevented. Similarly, in the joined surfaces 22 and 31 of the metal members 20 and 30, sealing is secured for the connected parts of the A gas path holes 3 and 4, because of the junction of the peripheries thereof by press forging and compressing the annular protrusion 24 and the annular groove 36. Accordingly, the leakage of A gas from the connected parts can be prevented, and the incursion of other gases can also be prevented. In the joined surfaces 22 and 31 of the metal members 20 and 30, sealing is secured because of the junction by press forging and compressing the annular protrusion 23 and the annular groove 35 in the outer periphery. Accordingly, the leakage of gas from the gas dispersion nozzle plate to the outside can be prevented.

Second Example

Next, explanation will be made of a second embodiment of the invention by referring to FIGS. 13(a) to 15(c).

The second embodiment is different from the first in the positions of annular protruded portions and annular grooves provided in the joined surfaces of the metal members to be laminated.

Figure 13A:
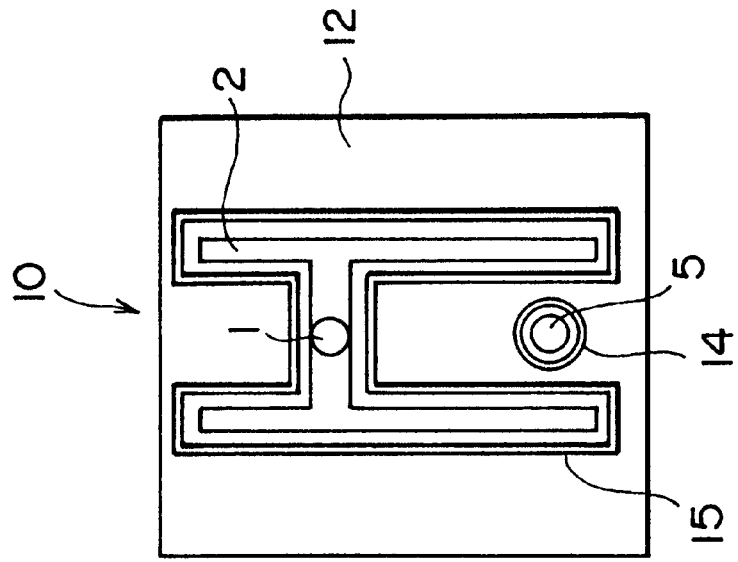
FIGS. 13(a) to 13(c) are views, each showing positions of an annular protrusion and an annular groove of a metal member according to a second embodiment of the invention.
Figure 13B:
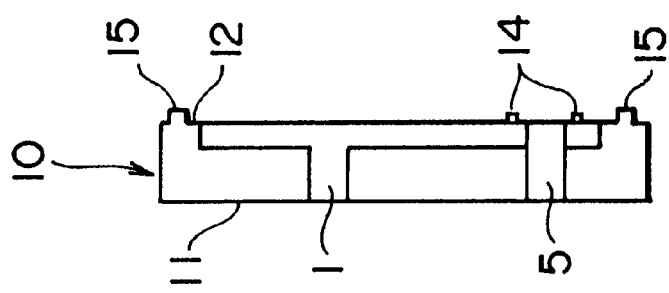

FIG. 13(a) is a plan view of the outer surface (gas supply side) of the metal member 10; FIG. 13(b) a sectional view of the metal member 10; and FIG. 13(c) a plan view of the joined surface of the metal member 10. FIG. 14(a) is a plan view of the joined surface of the metal member 20 with the metal member 10; FIG. 14(b) a sectional view of the metal member 20; and FIG. 14(c) a plan view of the joined surface of the metal member 20 with the metal member 30. FIG. 15(a) is a plan view of the joined surface of the metal member 30 with the metal member 20; FIG. 15(b) a sectional view of the metal member 30; and FIG. 15(c) a plan view of the outer surface (gas outlet side) of the metal member 30.

Figure 13C:
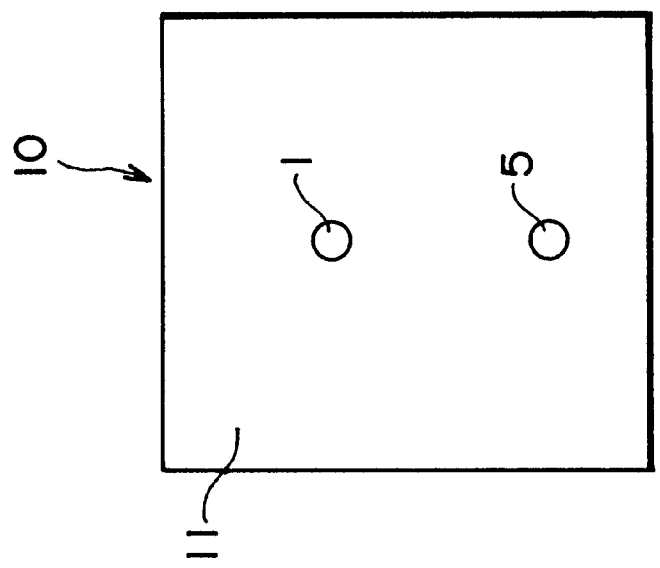
Figure 14A:
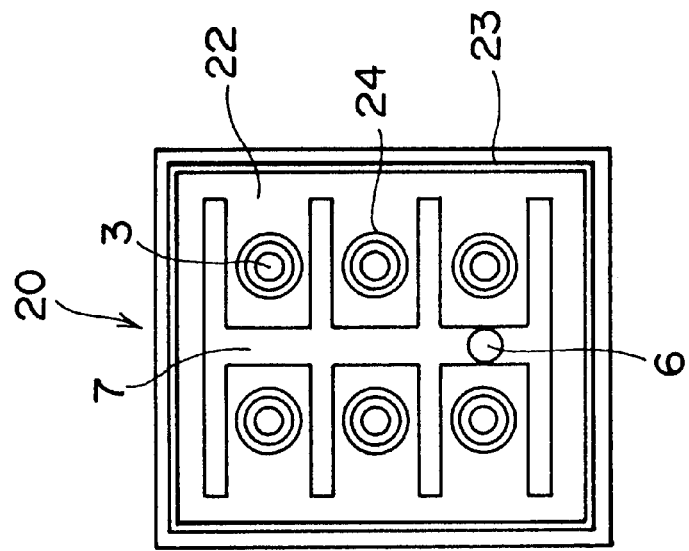
FIGS. 14(a) to 14(c) are views, each showing positions of an annular protrusion and an annular groove of a metal member of the second embodiment.
Figure 14B:
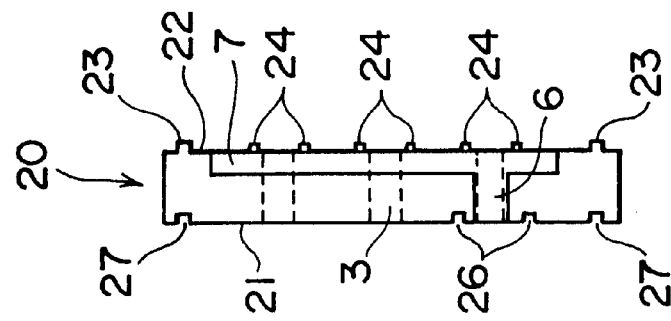

As shown in FIGS. 13(a) to 13(c), the metal member 10 includes an A gas path hole 1, a branch 2 having an H groove shape, and a B gas path hole 5. In the joined surface 12, annular protrusion 15 and 14 are formed respectively around the A gas branch 2 of the H shape, and around the B gas path hole 5.

Figure 14C:
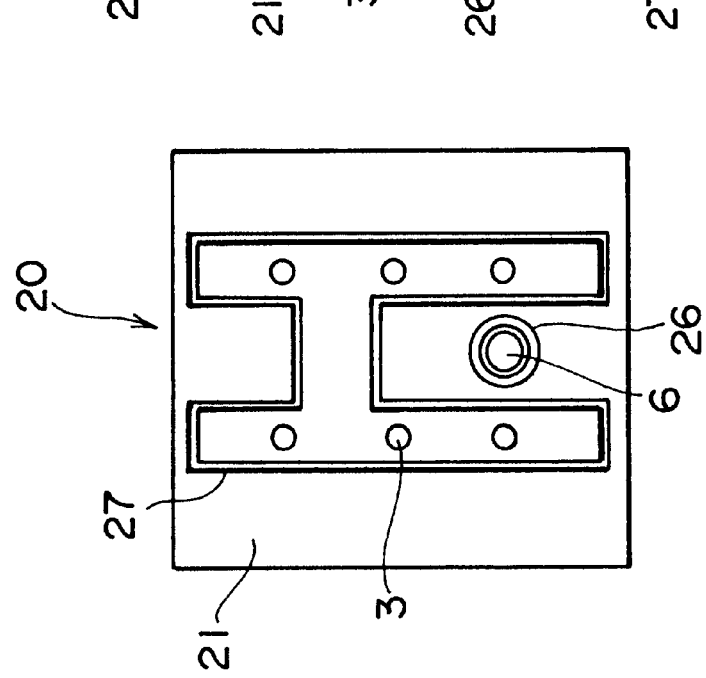

As shown in FIGS. 14(a) to 14(c), the metal member 20 includes a plurality of A gas path holes 3 formed in positions corresponding to the H groove-shaped branch 2 of the metal member 10, a path hole 6 connected to the B gas path hole 5, and a B gas branch 7 having a frame-like groove shape.

In the joined surface 21 of the metal member 20, an annular groove 27 is provided, and an annular groove 26 is provided around the gas path hole 6. Specifically, the annular groove 27 is formed in a position opposite the annular protrusion 15 of the metal member 10; and the annular protrusion 26 in a position opposite the annular protrusion 14 of the metal member 10.

Figure 15C:
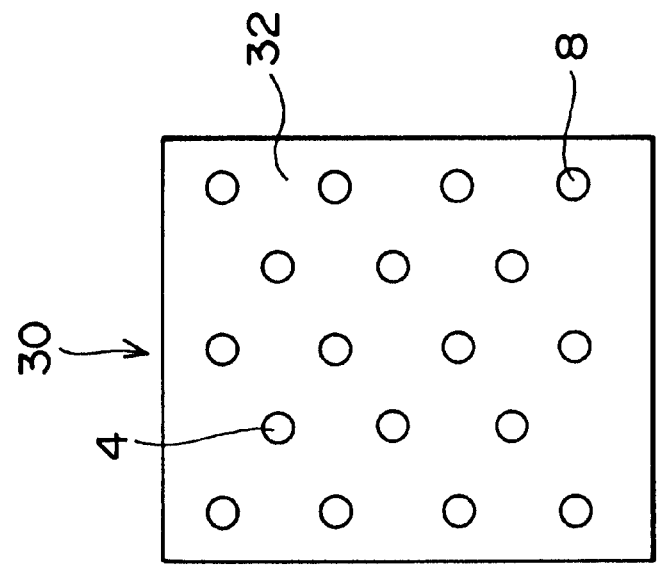
FIGS. 15(a) to 15(c) are views, each showing positions of an annular protrusion and an annular groove of a metal member of the second embodiment.
Figure 15B:
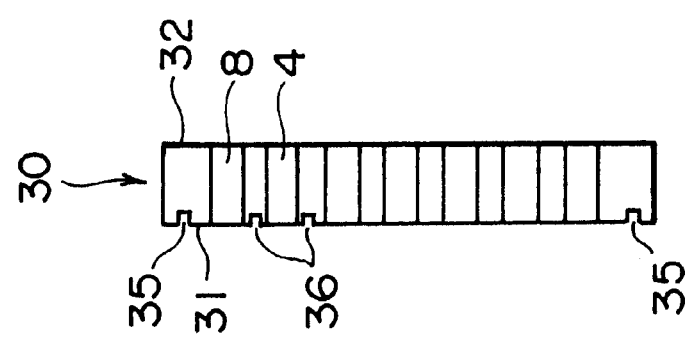
Figure 15A:
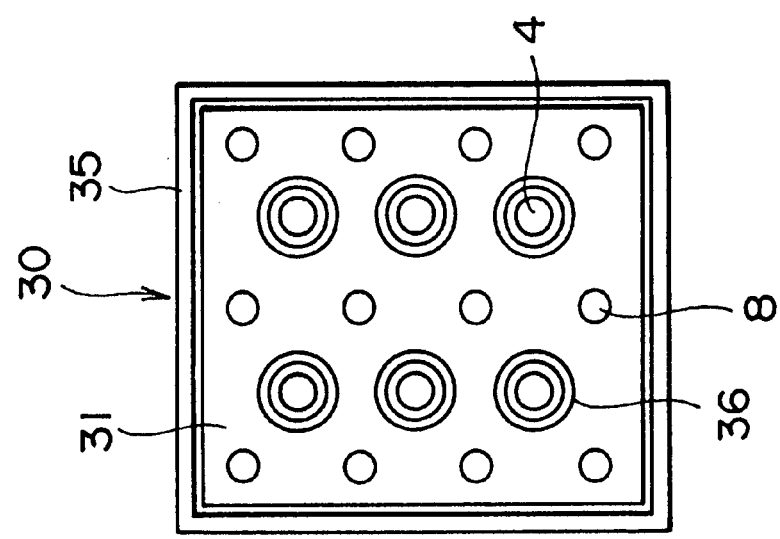

In the other joined surface 22 of the metal member 20, annular protrusions 23 and 24 are formed respectively in the outer periphery and around the gas path hole 3. As shown in FIGS. 15(a) to 15(c), the metal member 30 includes a plurality of A gas path holes 4, and a plurality of B gas path holes 8. Specifically, the plurality of gas path holes 4 are disposed in positions respectively corresponding to the plurality of gas path holes 3 of the metal member 20; and the plurality of gas path holes 8 in positions corresponding to the gas branch portion 7 of the frame-like groove shape.

In the joined surface 31 of the metal member 30, annular grooves 35 and 36 are formed respectively in the outer periphery and around the A gas path hole 4. Specifically, the annular groove 35 is formed in a position opposite the annular protrusion 23 formed in the joined surface 22 of the metal member 20; and the annular groove 36 in a position opposite the annular protrusion 24 formed in the joined surface 22 of the metal member 20.

As shown in FIGS. 13(a) to 15(c), the metal members 10, 20 and 30 respectively having the gas path holes, the branch, the annular protrusion and the annular grooves are joined together by press forging, and thereby the gas dispersion nozzle plate is manufactured. In this gas dispersion nozzle plate, the joined surfaces 12 and 21 of the metal members 10 and 20 are joined together by press forging the annular protrusion 14 and the annular groove 26 around the connected parts of the gas path holes 5 and 6, and by press forging and compressing the annular protrusion 15 and the annular groove 27 around the connected parts of the branch 2 and the plurality of gas path holes 3. Sealing is thus secured to prevent the leakage of gas, and also the incursion of other gases.

Similarly to the case described above with reference to FIGS. 2 to 9, the joined surfaces 22 and 31 of the metal members 20 and 30 are sealed by the annular protrusion 24 and the annular groove 36 around the connected parts of the gas path holes 3 and 4. The joined surfaces 22 and 31 of the metal members 20 and 30 are also sealed by the annular protrusion 23 and the annular groove 35 in the outer periphery. Accordingly, the leakage of gas can be prevented, and the incursion of gas can be prevented.

Third Embodiment

Figure 16:
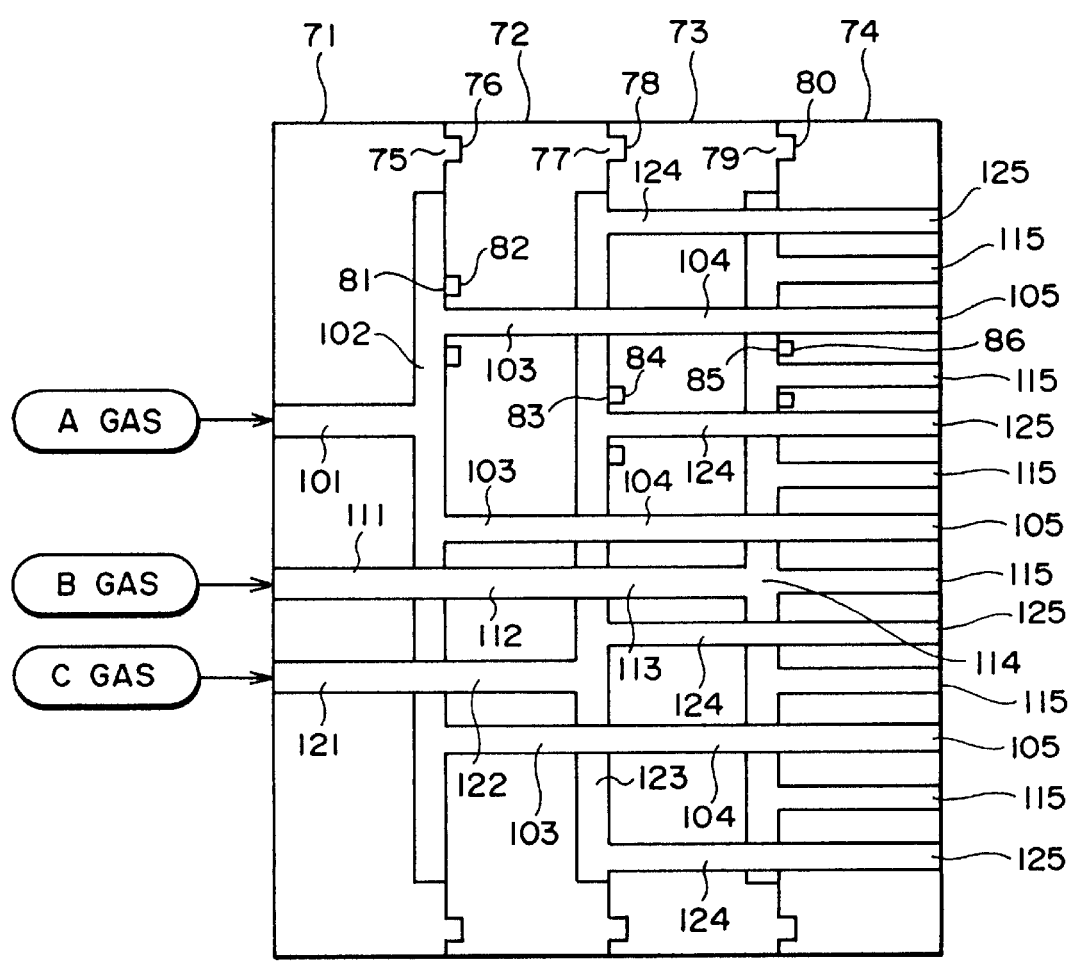
FIG. 16 is a sectional view showing a nozzle plate according to a third embodiment of the invention.

Next, explanation will be made of a third embodiment of the invention by referring to FIG. 16. According to the third embodiment, a gas dispersion nozzle plate is constructed by laminating four metal members, and adapted to disperse each of three kinds of gases widely in stages. FIG. 16 is a sectional view of such a gas dispersion nozzle plate constructed by laminating four sheet metal members. The gas dispersion nozzle plate constructed by laminating four metal members 71 to 74 is now described.

The metal members 71 and 72 are joined together by press forging an annular protrusion 75 and an annular groove 76 in the outer periphery, and an annular protrusion 81 and an annular groove 82 around the connected part of a gas path hole. The junction by the annular protrusion and the annular groove is provided so as to prevent the mixing of different kinds of gases at each gas path hole or branch. In FIG. 16, only a portion of the junction is shown, omitting the others.

The metal members 72 and 73 are joined together by press forging an annular protrusion 77 and an annular groove 78 in the outer periphery, and an annular protrusion 83 and an annular groove 84 around the connected part of a gas path hole.

The metal members 73 and 74 are joined together by press forging an annular protrusion 79 and an annular groove 80 in the outer periphery, and an annular protrusion 85 and an annular groove 86 around the connected part of a gas path hole.

In the gas dispersion nozzle plate thus constructed by laminating the four metal members 71 to 74, A gas is passed through a path hole 101, and widely dispersed at a branch 102. The A gas is then caused to flow out through a number of path holes 103, 104 and 105, and supplied to a film-forming side.

B gas is passed through path holes 111, 112 and 113, and widely dispersed at a branch 114. The B gas is then caused to flow out through a number of path holes 115, and supplied to the film-forming side.

C gas is passed through path holes 121 and 122, and widely dispersed at a branch 123. The C gas is then caused to flow out through a number of path holes 124 and 125, and supplied to the film-forming side.

Each of the A, B and C gases widely dispersed in stages is supplied through the number of path holes to the film-forming side, and mixed with another gas immediately before the substrate to form a film.

Fourth Embodiment

Figure 17:
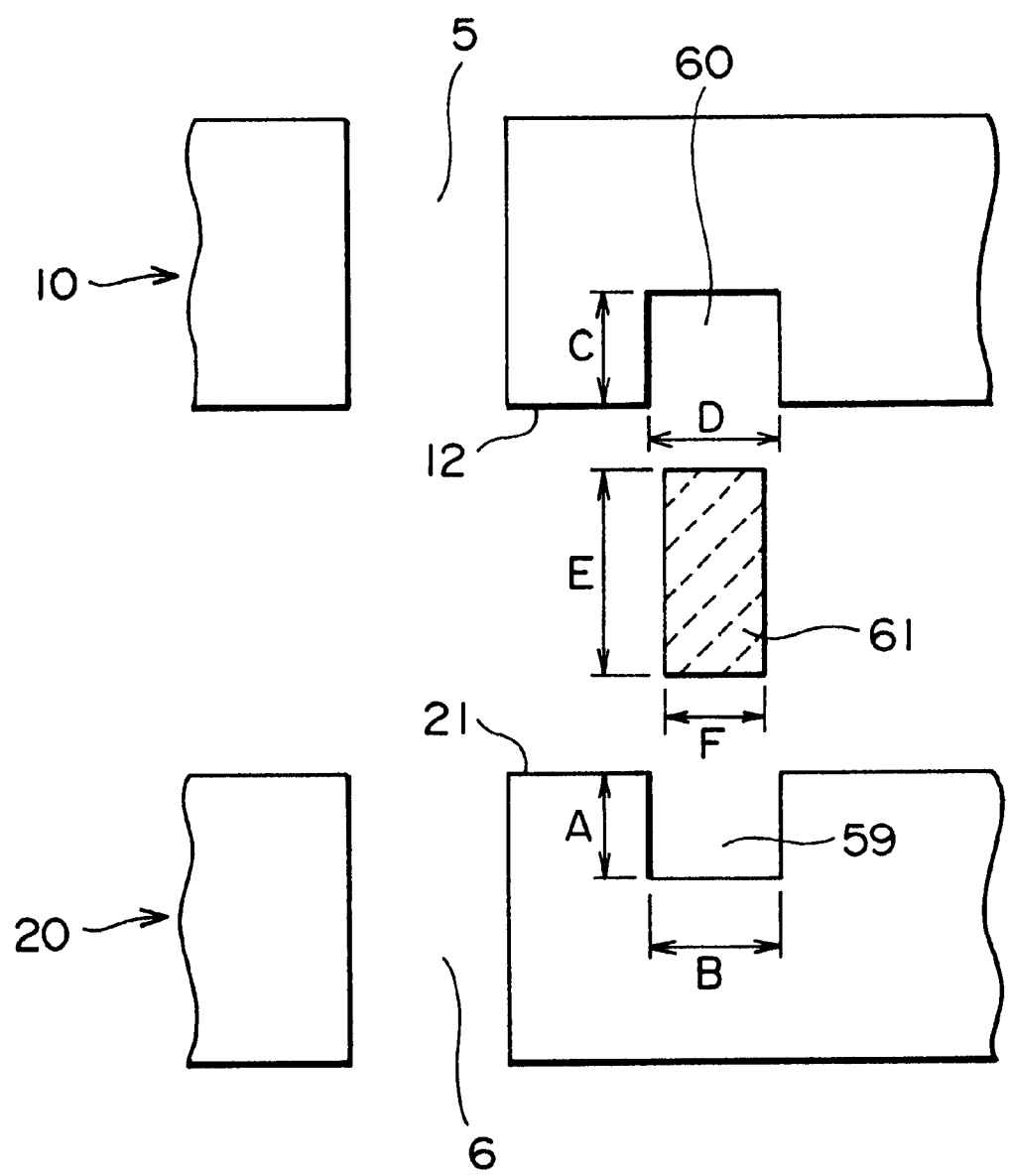
FIGS. 17 to 19 are views, each showing an annular groove of a metal member on the surface according to a fourth embodiment of the invention.

Next, explanation will be made of a fourth embodiment of the invention by referring to FIGS. 17 to 19. According to the fourth embodiment, annular grooves are respectively provided in the opposing positions of the joined surfaces of metal members to be laminated, an intermediate metal member is inserted into each of the annular grooves, and then press forging is executed for junction. FIG. 17 is an expanded view showing joined parts around the gas path holes 5 and 6 of the aluminum plates 10 and 20. In the joined surface 12 of the aluminum plate 10, an annular groove 60 is formed around the gas path hole 5. In the joined surface 21 of the aluminum plate 20, an annular groove 59 is formed around the gas path hole 6. An intermediate metal member 61 is inserted into the annular grooves 59 and 60. For the intermediate metal member, preferably, an aluminum material similar to those for the aluminum plates 10 and 20 should be used. However, one can be selected for use from other aluminum materials.

If the widths and depths of the annular grooves 59 and 60 are respectively B and D, and A and C, and the width and length of the intermediate metal member 61 are F and E, then the annular grooves 59 and 60 and the intermediate metal member 61 should preferably be formed to satisfy the following relations:

$$A+C \leq E, (A \times B + C \times D) \leq E \times F, B \geq F, D \geq F$$

A joined part is formed by inserting the intermediate metal member 61 into the annular grooves 60 and 59 of the aluminum plates 10 and 20, executing press forging, and then filling the annular grooves 59 and 60 with the intermediate metal member 60. In this way, sealing is secured to prevent the leakage of gas.

Figure 18:
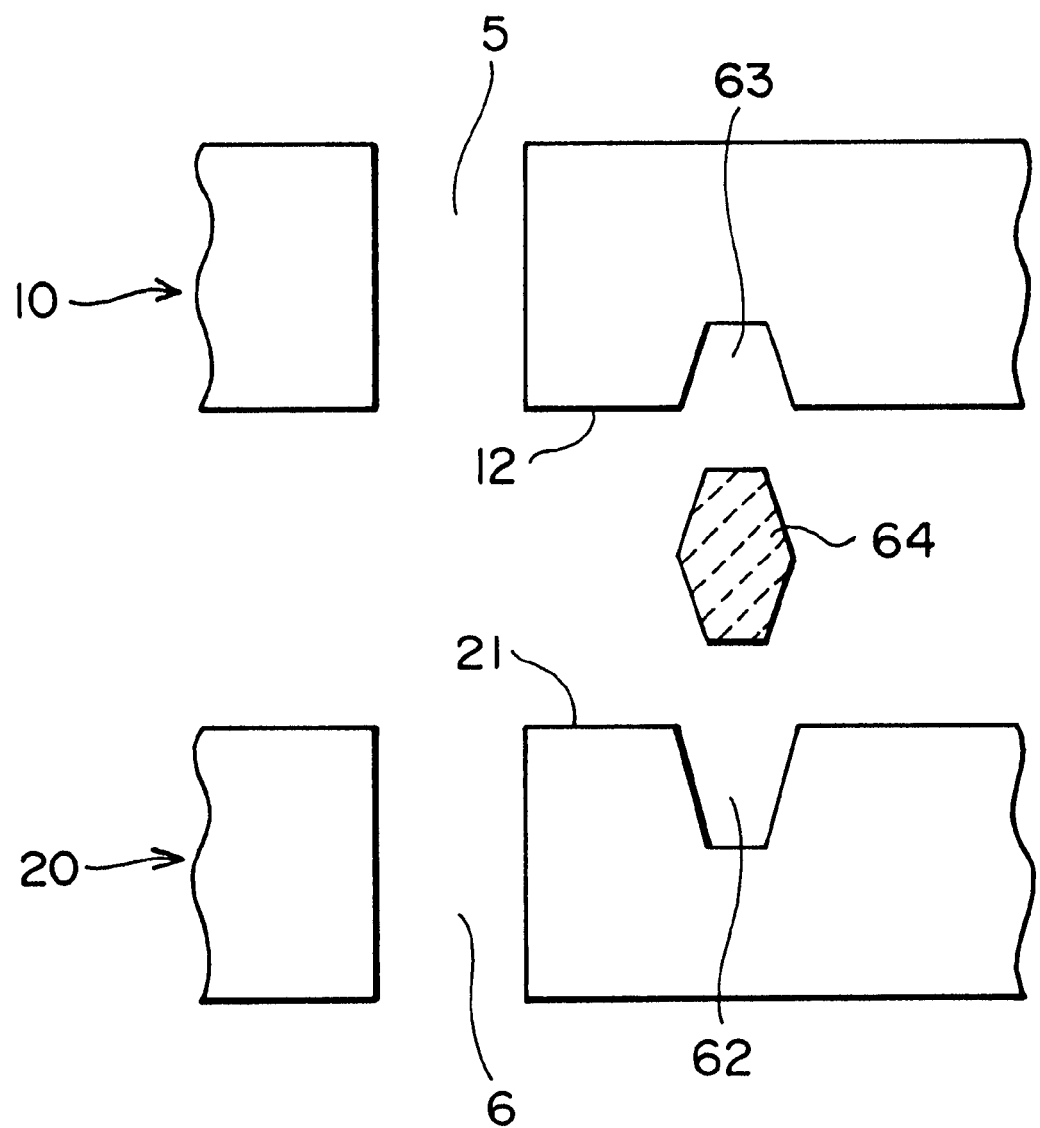
Figure 19:
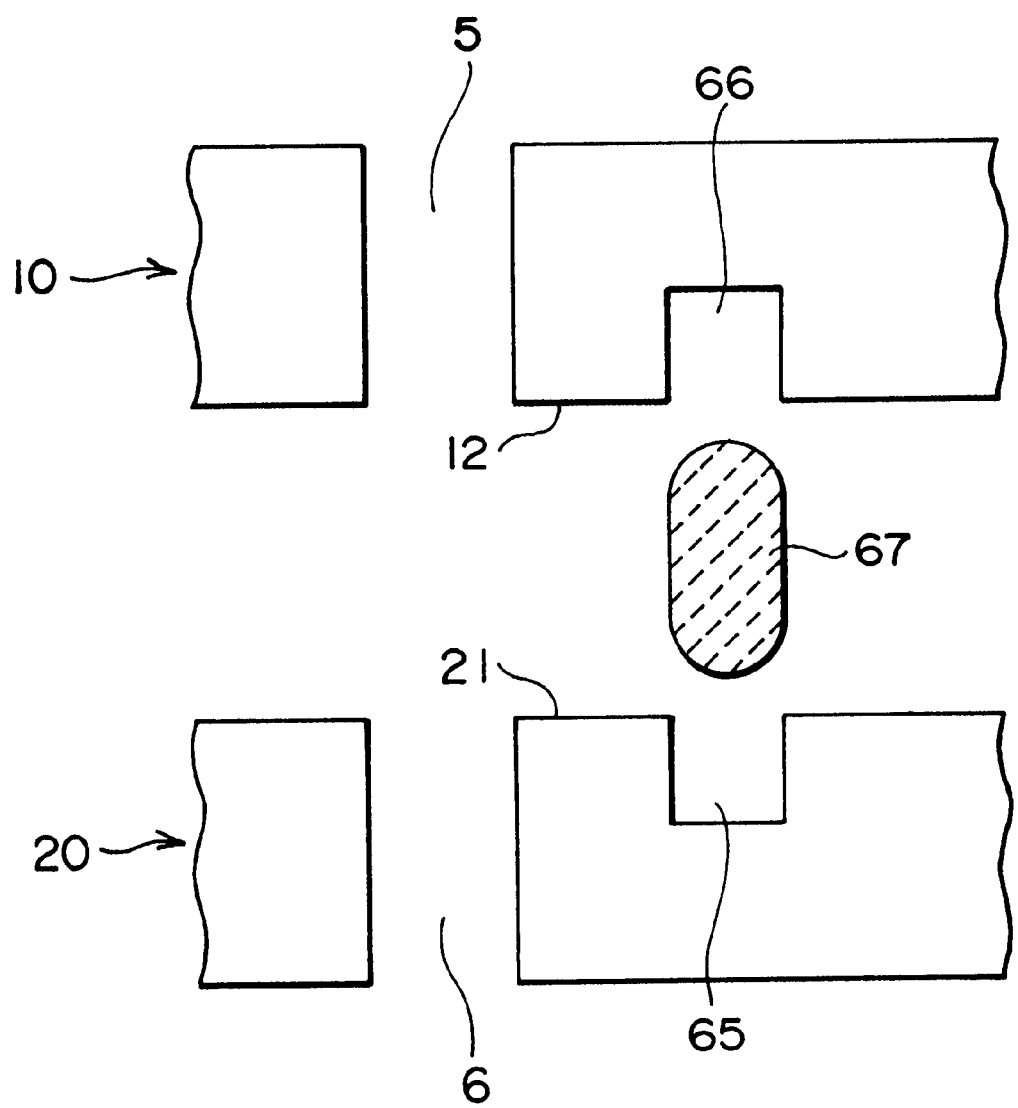

FIGS. 18 and 19 are expanded views of joined parts around the gas path holes 5 and 6 of the aluminum plates 10 and 20, showing other examples of annular groove shapes and intermediate metal members.

A joined part shown in FIG. 18 is formed in the following manner. That is, in the joined surface 12 of the aluminum plate 10, an annular groove 63 trapezoidal in section is formed around the gas path hole 5. In the joined surface 21 of the aluminum plate 20, an annular groove 62 trapezoidal in shape is formed around the gas path hole 6. An intermediate metal member 64 having a hexagonal shape corresponding to the trapezoidal shapes of the annular grooves 62 and 63 is inserted, and press forging is executed. Then, the annular grooves 62 and 63 are filled with the intermediate metal member 64. Thus, sealing is secured.

A joined part shown in FIG. 19 is formed in the following manner. That is, in the joined surface 12 of the aluminum plate 10, an annular groove 66 U-shaped in section is formed around the gas path hole 5. In the joined surface 21 of the aluminum plate 20, an annular groove 65 U-shaped in section is formed around the gas path hole 6. An intermediate metal member 67 having an elliptic shape is inserted into the U-shaped annular grooves 65 and 66, and press forging is executed. Then, the annular grooves 65 and 66 are filled with the intermediate metal member 67. Thus, sealing is secured.

The annular grooves and the intermediate metal member having the shapes shown in FIG. 18 are advantageous in that the machining of the annular grooves is easy, and the insertion of the intermediate member is easy when it is combined with the annular grooves.

The intermediate metal member having the shape shown in FIG. 19 is advantageous in that the insertion of the intermediate member is easy when it is combined with the annular grooves.

Fifth Embodiment

Next, explanation will be made of a fifth embodiment of the invention by referring to FIGS. 20 to 22. The fifth embodiment gives another example regarding the shapes of an annular groove and an annular protrusion provided in the opposing positions of the joined surfaces of the metal members to be laminated.

Figure 20:
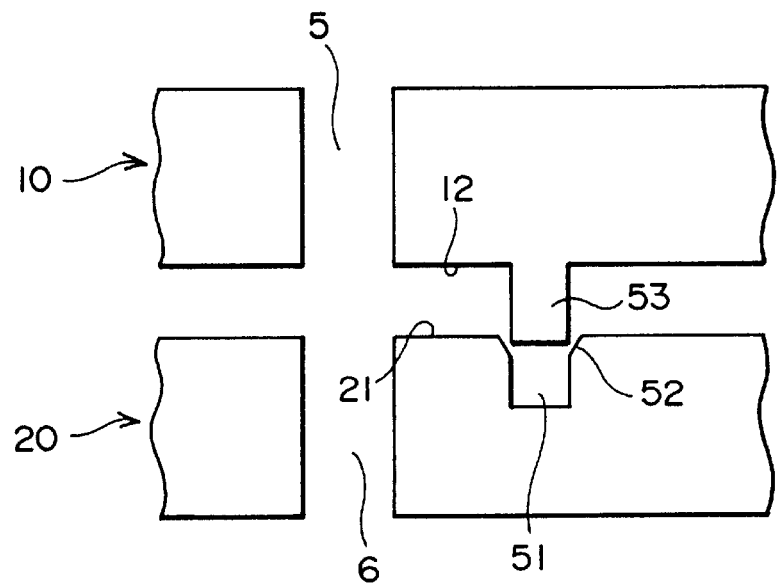
FIGS. 20 to 22 are views, each showing an annular groove and an annular protrusion of a metal member on the surface according to a fifth embodiment of the invention.

A joined part shown in FIG. 20 is formed in the following manner. That is, in the joined surface 12 of the aluminum plate 10, an annular protrusion 53 U-shaped in section is formed around the gas path hole 5. In the joined surface 21 of the aluminum plate 20, an annular groove 51 U-shaped in section is formed around the gas path hole 6. Then, a tapered part 52 is provided in the annular protruded groove 51. Accordingly, the insertion of the annular protrusion into the annular groove is facilitated.

Figure 21:
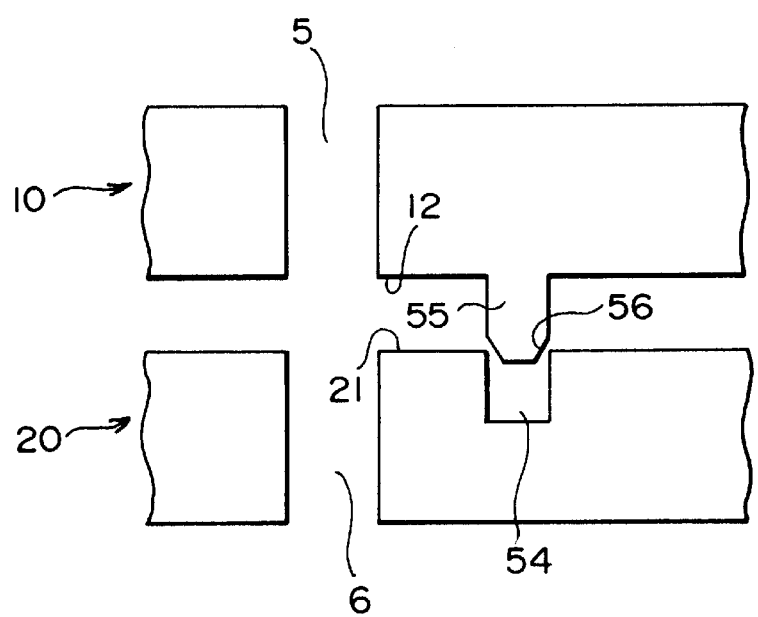

A joined part shown in FIG. 21 is formed in the following manner. That is, in the joined surface 12 of the aluminum plate 10, an annular protrusion 55 having a tapered part 56 and U-shaped in section is formed around the gas path hole 5. In the joined surface 21 of the aluminum plate 20, an annular groove 54 U-shaped in section is formed around the gas path hole 6. The presence of the tapered part 56 in the annular protrusion 55 facilitates the insertion of the annular protrusion into the annular groove.

Figure 22:
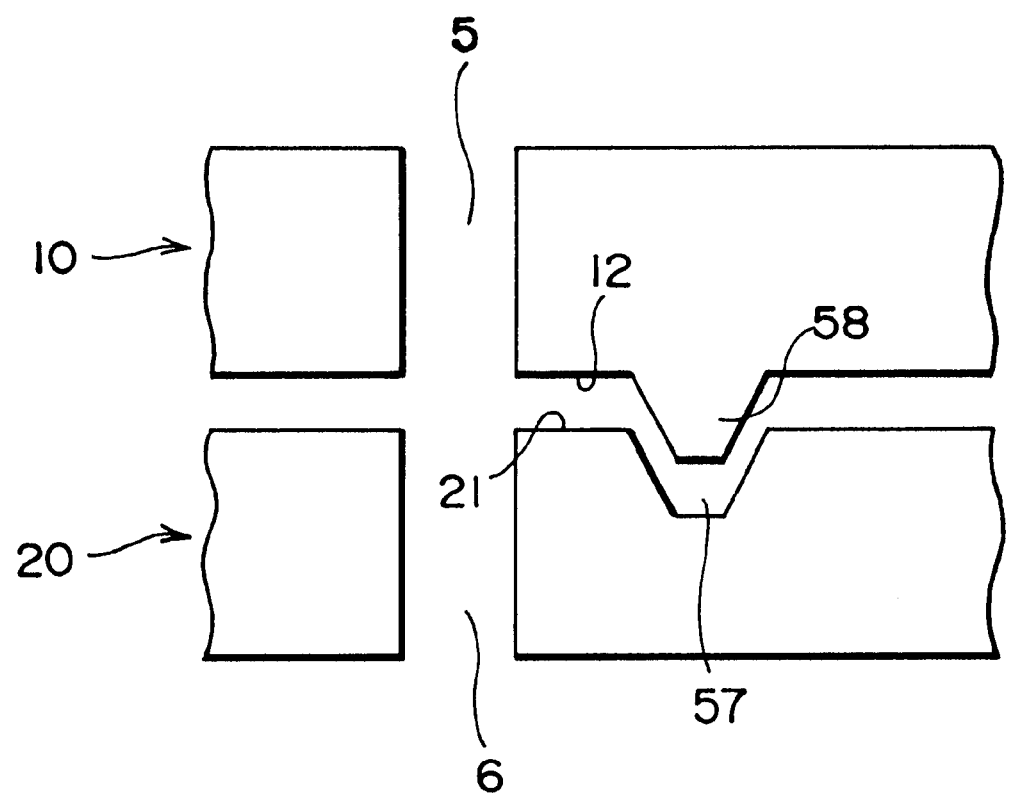

A joined part shown in FIG. 22 is formed in the following manner. That is, in the joined surface 12 of the aluminum plate 10, an annular protrusion trapezoidal in section is formed around the gas path hole 5. In the joined surface 21 of the aluminum plate 20, an annular groove 57 trapezoidal in section is formed around the gas path hole 6. The machining of the annular groove and the annular protrusion is easy, and the insertion of the annular protrusion is easy when it is combined with the annular groove.

Sixth Embodiment

Figure 23:
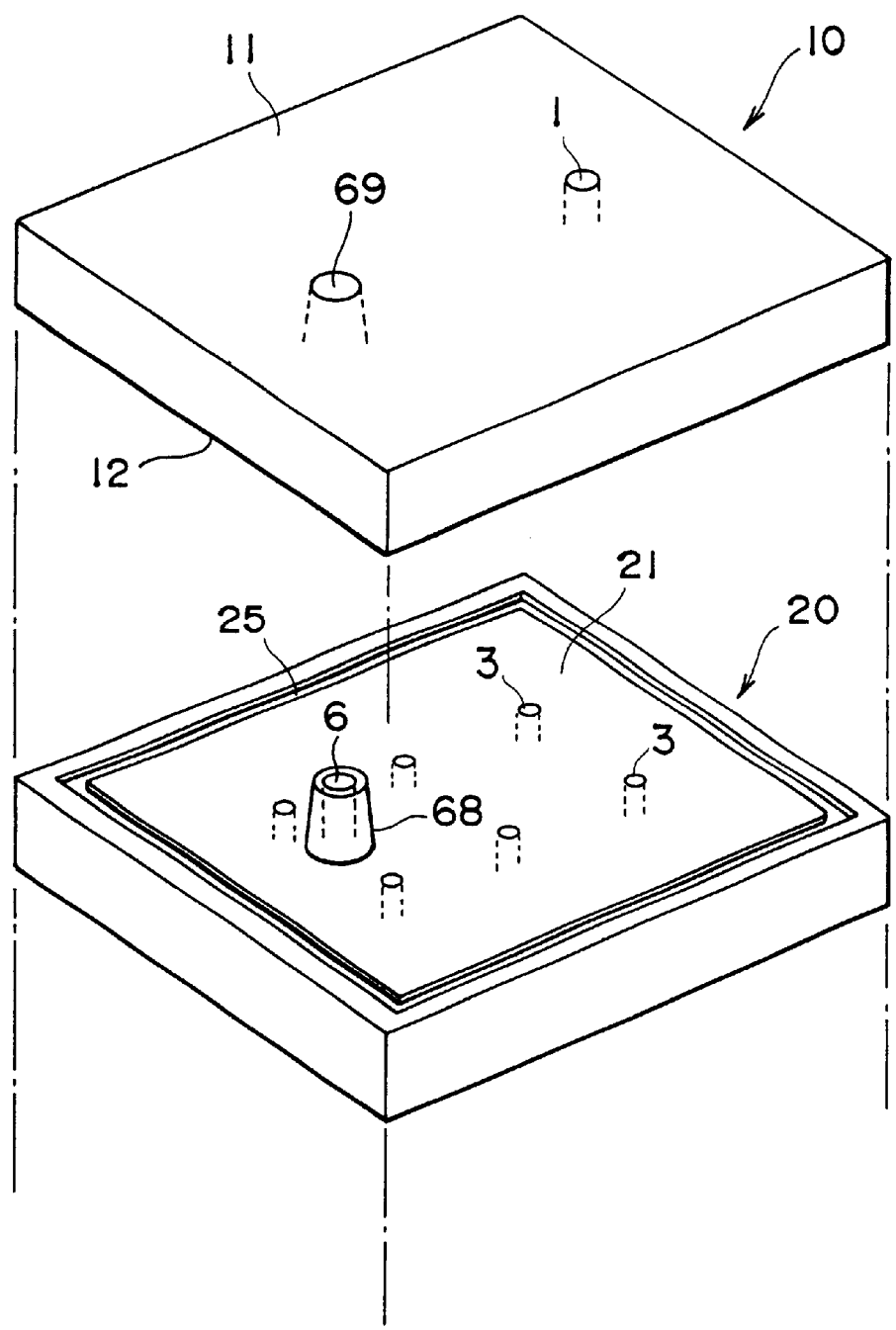
FIG. 23 is a view showing a laminated state of metal members according to a sixth embodiment of the invention.

Next, explanation will be made of a sixth embodiment by referring to FIGS. 23 to 25. FIG. 23 is a perspective view showing the lamination of metal members according to the sixth embodiment; FIGS. 24(a), 24(b) and 25 sectional views, each showing the joined surfaces of the metal members to be laminated.

The sixth embodiment gives a modified example of the gas dispersion nozzle plate constructed by laminating the aluminum plates 10 and 20, described above with reference to the first embodiment, specifically regarding the connection of the B gas path hole 6 between the aluminum plates 10 and 20.

As shown in FIG. 23, in the aluminum plate 10, an A gas path hole 1 and a hole 69 are formed from the outer surface 11 to the joined surface 12. In the joined surface 21 of the aluminum plate 20, an annular groove 25 is formed in the outer periphery, an A gas path hole 3 is formed, and a cylinder 68 having a B gas path hole 6 is protruded.

Figure 24A:
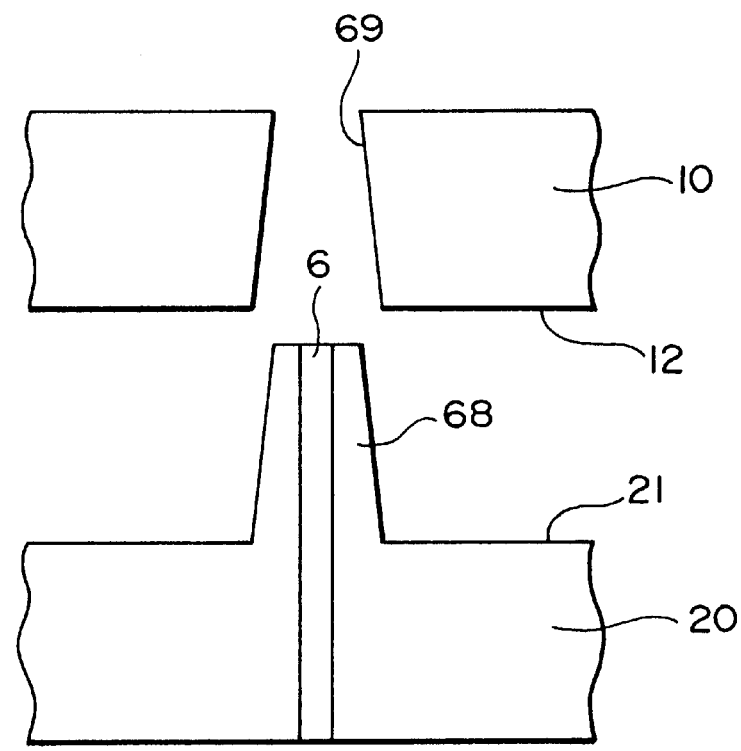
FIGS. 24(a) and 24(b) are sectional views, each showing a metal member provided with a protrusion inserted through the second metal member in the sixth embodiment.
Figure 24B:
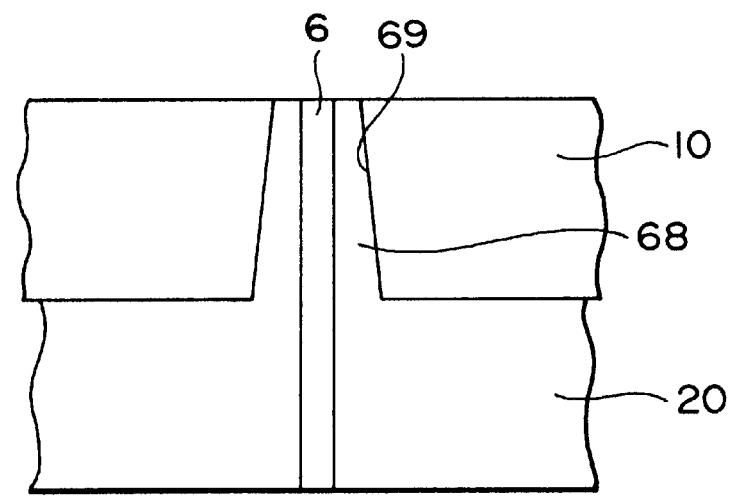
Figure 25:
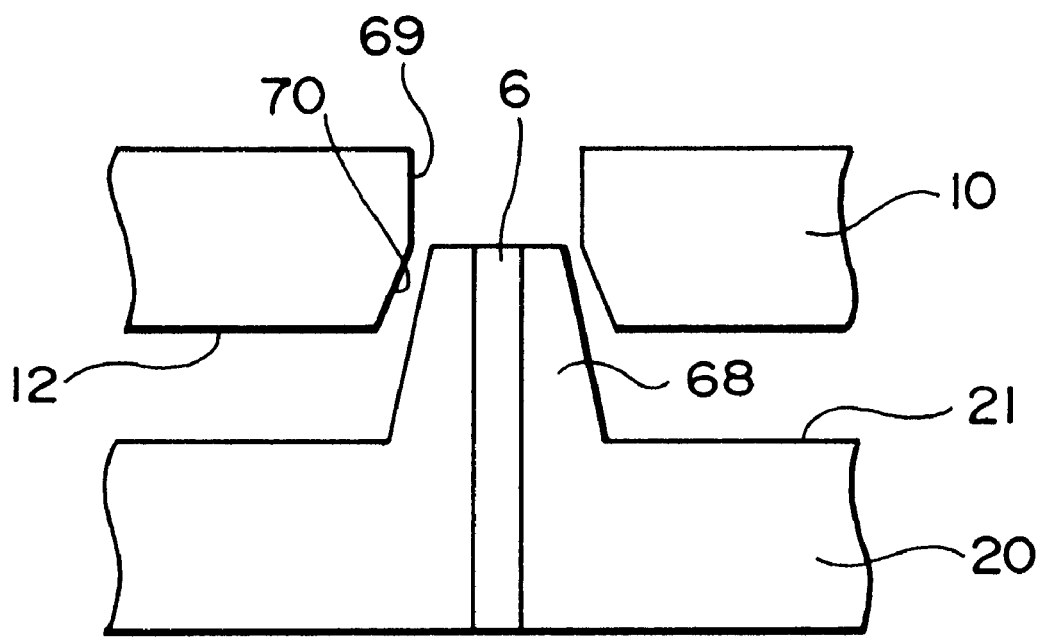
FIG. 25 is a sectional view showing metal members joined by a protrusion in the sixth embodiment.

As shown in FIG. 24(a), the hole 69 of the aluminum plate 10 is tapered from the joined surface 12 to the outer surface 11. The cylinder 68 of the aluminum plate 20 is also tapered, and the gas path hole 6 is formed therein.

The aluminum plates 10, 20, and so on, are laminated, the A gas path hole, its branch, the B gas path hole and its branch are aligned, the annular groove and the annular protrusion are combined together, and press forging and compression are performed for junction. In this case, as shown in FIG. 24(b), the tapered cylinder 68 is inserted into the hole 69 of the aluminum plate 10 to form a B gas path hole.

FIG. 25 shows a joined part formed by providing a chamfered part in the joined surface 12 side of the hole 69 of the aluminum plate 10, thereby facilitating the insertion of the tapered cylinder 68 of the aluminum plate 20.

As described above, according to the invention, good sealing is provided by press forging the surfaces of the metal members to be laminated for junction. The invention is particularly advantageous in that high sealing is secured by providing the annular groove and the annular protrusion in the opposing positions of the joined surface of the plurality of sheet metal members having fluid paths and/or branch, and press forging these portions for junction, and accordingly the leakage of fluids such as gas or the like can be prevented. The invention is also advantageous in that high sealing is secured by providing the annular grooves in the opposing positions of the joined surface of the plurality of metal members having fluid paths and/or branch, and inserting the intermediate metal member for junction, and accordingly the leakage of fluids such as gas or the like can be prevented.

Further, the annular groove and the annular protrusion are formed by machining, and press forging is executed for junction. No inclusions, such as jointing materials or the like, are used. Thus, the problem of gas generation from the inclusion or the like for junction is prevented during use, making it possible to keep cleanness in the chamber of CVD device, the nozzle plate of the invention being disposed therein. In addition, during junction, the problem of solder melting or the like seen in the soldering method is prevented, making it possible to prevent the precisely machined hole or groove from being clogged. No sealing members such as an O-ring or the like are necessary, enabling the nozzle plate to be used until the limit of the heat resisting temperature is reached for the laminated metal plates (aluminum or aluminum alloy). Depending on a heat resisting temperature, the composition of an aluminum alloy can be changed, or other metallic materials to be joined by pressure can be used instead.

Furthermore, a high degree of designing freedom is provided because the precise holes or grooves to serve as gas paths or branch portions can be formed by machining. Concave and convex portions (annular groove and annular protrusion) necessary for junction by press forging are formed simultaneously with the formation of the gas path hole and the branch. Low-cost manufacturing is possible by combining the metal plates for junction, and subjecting these plates to simultaneous press forging. Moreover, since pressurizing by a press is only necessary during press forging, even a large size can be easily dealt with.

What is claimed is:

1. A nozzle plate member for supplying fluids in a dispersed manner, comprising:
   a plurality of plate-like metal members each having a fluid path and/or a branch for supplying fluids on the surface of the metal members;
   said metal members being provided with either one or both of (1) an annular groove or an annular protrusion on the periphery of the same surface of metal members and (2) an annular groove provided around the fluid path and/or a branch portion on a surface of one of the metal members and an annular protrusion provided around the fluid path and/or a branch on a surface of the metal member oppositely to the former;
   wherein the plurality of plate-like metal members are laminated by inserting the protrusions into the grooves and the laminated surfaces thereof are joined together by press forging to form metal bonding.

2. A nozzle plate member for supplying fluids in a dispersed manner according to claim 1, wherein further a fluid path and/or the branch is provided for each kind of fluids, the each kind of the fluids is dispersed to flow out, an annular groove and an annular protrusion are provided around the each fluid path and/or the branch in opposing positions of the surfaces of the metal members, the annular protrusion is inserted into the annular groove, and then press forging is executed for junction.

3. A nozzle plate member for supplying fluids in a dispersed manner according to claim 1, wherein each of the metal members is made of aluminum metal or an aluminum alloy.

4. A nozzle plate member for supplying fluids in a dispersed manner according to claim 3, wherein further the fluid path and/or the branch formed in the metal member made of the aluminum metal or the aluminum alloy is subjected to a surface-treatment to prevent corrosion by the fluids.

5. A nozzle plate member for supplying fluids in a dispersed manner according to claim 1, wherein the nozzle plate member is adapted to disperse and supply gas for film formation on a semiconductor device or a liquid crystal display device.

6. A manufacturing method of a nozzle plate member for supplying fluids in a dispersed manner, comprising the steps of:
   preparing a plurality of plate-like metal members each having a fluid path and/or a branch on a surface of the metal member and either one or both of (1) an annular groove or an annular protrusion on a periphery of the same surface of the metal member; and (2) an annular groove provided around the fluid path an/or a branch on a surface of one of the metal members and an annular protrusion provided around the fluid path an/or a branch in another surface of the metal member being placed oppositely to the former;
   laminating the plurality of plate-like metal members by inserting by the protrusions into the grooves, and
   joining the laminated surface thereof by press forging to form metal bonding.

7. A manufacturing method of a nozzle plate member for supplying fluids in a dispersed manner according to claim 6, wherein the each of the metal members is made of aluminum metal or an aluminum alloy.

8. A manufacturing method of a nozzle plate member for supplying fluids in a dispersed manner according to claim 7, wherein further a step is provided to subject the fluid path and/or the branch formed in the metal member made of one selected from the aluminum metal or the aluminum alloy to surface treatment to prevent surface corrosion in advance of the press forging.

9. A manufacturing method of a nozzle plate member for supplying fluids in a dispersed manner according to claim 7, wherein the press forging is carried out at a pressure set in a range of 3 to 100 kgf/mm$^2$.

10. A manufacturing method of a nozzle plate member for supplying fluids in a dispersed manner according to claim 7, wherein the press forging is carried out at a temperature in a range of 300 to 500 degree C.

* * * * *